US011815770B2

(12) United States Patent
Ozeki et al.

(10) Patent No.: US 11,815,770 B2
(45) Date of Patent: Nov. 14, 2023

(54) DISPLAY DEVICE AND ARRAY SUBSTRATE

(71) Applicant: Japan Display Inc., Tokyo (JP)

(72) Inventors: Yoshitaka Ozeki, Tokyo (JP); Seiji Uejima, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/716,342

(22) Filed: Apr. 8, 2022

(65) Prior Publication Data

US 2022/0326579 A1 Oct. 13, 2022

(30) Foreign Application Priority Data

Apr. 9, 2021 (JP) ................................. 2021-066721

(51) Int. Cl.
| | |
|---|---|
| *G02F 1/1362* | (2006.01) |
| *G02F 1/1335* | (2006.01) |
| *G02F 1/1343* | (2006.01) |
| *G02F 1/1339* | (2006.01) |
| *H01L 27/12* | (2006.01) |
| *G02F 1/1368* | (2006.01) |

(52) U.S. Cl.
CPC .... *G02F 1/136209* (2013.01); *G02F 1/13439* (2013.01); *G02F 1/133512* (2013.01); *G02F 1/134318* (2021.01); *G02F 1/134363* (2013.01); *G02F 1/13394* (2013.01); *G02F 1/13685* (2021.01); *G02F 1/136286* (2013.01); *H01L 27/124* (2013.01)

(58) Field of Classification Search
None
See application file for complete search history.

(56) References Cited

U.S. PATENT DOCUMENTS

| | | | | |
|---|---|---|---|---|
| 5,517,341 | A | * | 5/1996 | Kim ..................... H01L 27/1255 349/139 |
| 2001/0012076 | A1 | * | 8/2001 | Ohkawara ......... G02F 1/136213 349/139 |
| 2003/0234971 | A1 | * | 12/2003 | Murade ............. G02F 1/136209 257/E27.111 |
| 2018/0052548 | A1 | * | 2/2018 | Katsuta ............... G02F 1/13338 |
| 2021/0055603 | A1 | * | 2/2021 | Kurokawa ........ G02F 1/133553 |

FOREIGN PATENT DOCUMENTS

| | | |
|---|---|---|
| JP | H10-206889 A | 8/1998 |
| KR | 20070118001 A * | 12/2007 |

* cited by examiner

*Primary Examiner* — Shan Liu
(74) *Attorney, Agent, or Firm* — K&L Gates LLP

(57) ABSTRACT

A display device includes a first substrate, a plurality of pixels on the first substrate, a first light shielding layer on the first substrate, a second substrate, and a second light shielding layer on the second substrate. The first light shielding layer extends in the first direction, the second light shielding layer extends in a second direction intersecting the first direction, and apertures of the plurality of pixels are defined by the first light shielding layer and the second light shielding layer.

16 Claims, 14 Drawing Sheets

DISPLAY DEVICE AND ARRAY SUBSTRATE

CROSS-REFERENCE TO RELATED APPLICATIONS

This application is based upon and claims the benefit of priority from the prior Japanese Patent Application No. 2021-066721, filed on Apr. 9, 2021, the entire contents of which are incorporated herein by reference.

BACKGROUND OF THE INVENTION

Field of the Invention

An embodiment of the present invention relates to the structure of pixels of a display device.

Description of Related Art

The liquid crystal panel is arranged with a light shielding film so that light incident from the outside does not affect the operation of a switching element (thin film transistor) by repeating multiple reflections inside. The structure and arrangement of the light shielding film arranged on the display panel are various. For example, Japanese Patent Laid-Open No. H10-206889 discloses a display device in which a light shielding film arranged on a substrate on which a switching element is formed, and a black matrix arranged on a counter substrate are formed of a metal film and a blackened transparent conductive film.

SUMMARY OF THE INVENTION

A display device in an embodiment according to the present invention includes a first substrate, a plurality of pixels on the first substrate, a first light shielding layer on the first substrate, a second substrate, and a second light shielding layer on the second substrate. The first light shielding layer extends in a first direction, the second light shielding layer extends in a second direction intersecting the first direction, and apertures of the plurality of pixels are defined by the first light shielding layer and the second light shielding layer.

An array substrate in an embodiment according to the present invention includes a first substrate, a plurality of pixels on the first substrate, a first light shielding layer arranged on the first substrate and extending in a first direction, a plurality of data signal lines extending in a second direction intersecting the first direction and intersecting the first light shielding layer, a pixel electrode arranged in each of the plurality of pixels, a common electrode overlapping the pixel electrode, and a common auxiliary electrode having a light shielding property and laminated on the common electrode. Each aperture of the plurality of pixels is defined by the first light shielding layer and the common auxiliary electrode.

DESCRIPTION OF THE EMBODIMENTS

Figure 1:
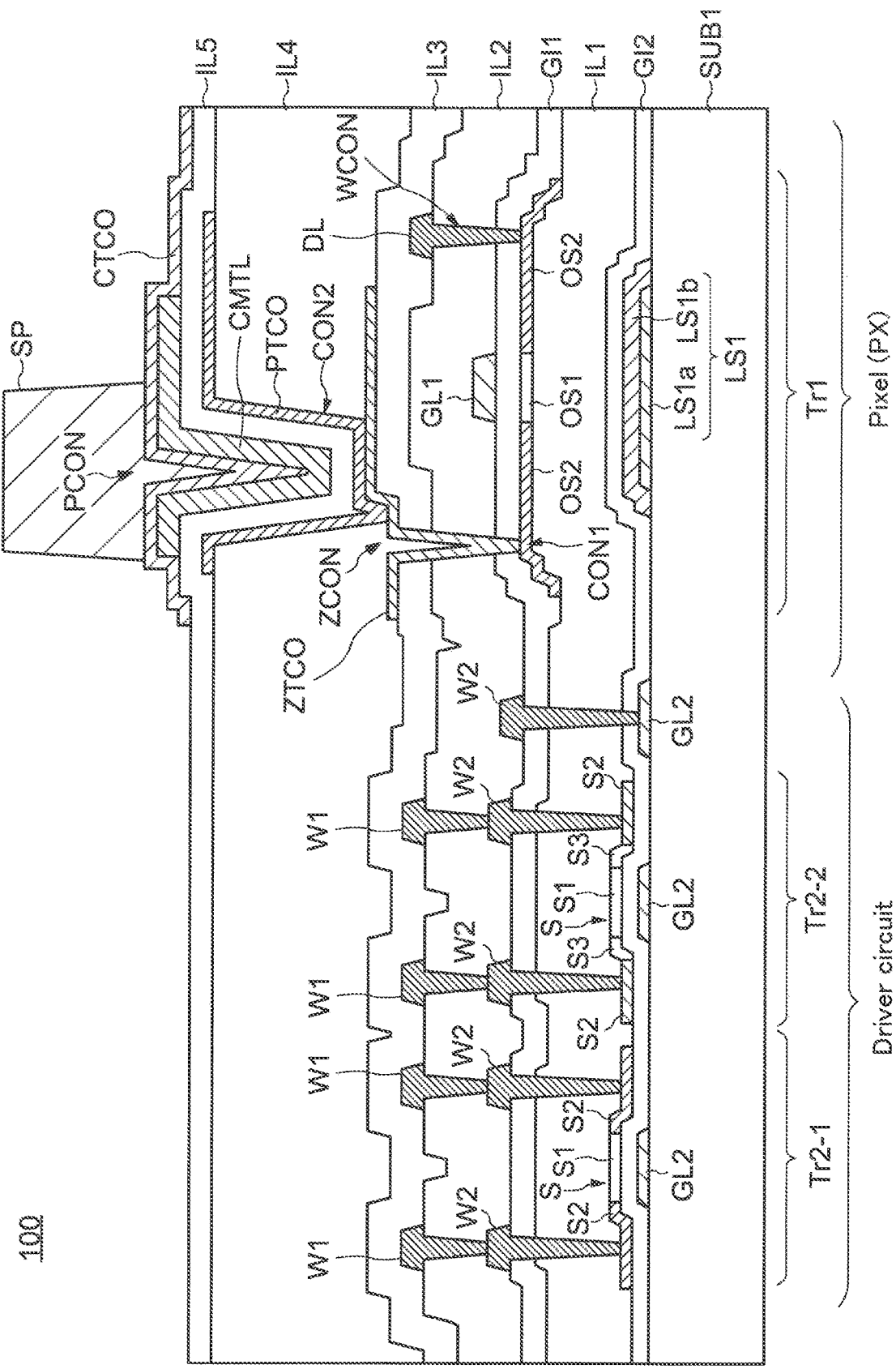
FIG. 1 is a cross-sectional view of the first substrate side of a display device according to an embodiment of the invention.

Hereinafter, embodiments of the present invention will be described with reference to the drawings and the like. The present invention may be carried out in various forms without departing from the gist thereof, and is not to be construed as being limited to any of the following embodiments. Although the drawings may schematically represent the width, thickness, shape, and the like of each part in comparison with the actual embodiment in order to clarify the description, they are merely examples and do not limit the interpretation of the present invention. In the present specification and each of the figures, elements similar to those described previously with respect to the figures already mentioned are designated by the same reference numerals (or numbers followed by a, b, etc.), and a detailed description thereof may be omitted as appropriate. Furthermore, the characters "first" and "second" appended to each element are convenient signs used to distinguish each element, and have no further meaning unless specifically described.

As used herein, where a member or region is "on" (or "below") another member or region, this includes cases where it is not only directly on (or just under) the other member or region but also above (or below) the other member or region, unless otherwise specified. That is, it includes the case where another component is included in between above (or below) other members or regions.

In each embodiment of the present invention, when a first conductive layer, a first insulating layer, and a semiconductor layer are laminated in this order on a substrate, the direction from the first conductive layer to the semiconductor layer is referred to as upper or above. On the contrary, a direction from the oxide semiconductor layer to the first is referred to as lower or below. As described above, for convenience of explanation, although the term above or below is used, for example, even in the case where the first conductive layer, the first insulating layer, and the semiconductor layer are laminated in this order on the lower side of the substrate as shown in the drawing, the direction from the first conductive layer to the semiconductor layer is also referred to as an upper or above direction. In the following description, for example, the expression "semiconductor layer on the substrate" only describes the vertical relationship between the substrate and the semiconductor layer as described above, and other layers such as the first conductive layer and the first insulating layer may be disposed between the substrate and the semiconductor layer. Above or below means the stacking order in the structure in which a plurality of layers is stacked, and in the case of describing the pixel electrode above the transistor, the transistor and the pixel electrode may have a positional relationship in which the transistor and the pixel electrode do not overlap each other in a plan view unless otherwise specifically limited. On the other hand, when it is expressed as a pixel electrode vertically above the transistor, it means a positional relationship in which the transistor and the pixel electrode overlap in a plan view.

The display panel usually corresponds to a color display, and one pixel includes a first sub-pixel corresponding to red, a second sub-pixel corresponding to green, and a third sub-pixel corresponding to blue. The aperture ratio of each sub-pixel is not necessarily the same, and the aperture ratio is adjusted in consideration of color balance. The aperture ratio is adjusted by changing the pattern of the light shielding film (also called a black matrix) on the side of the counter substrate where the color filter is formed. The light shielding film on the counter substrate is usually formed of a resin material containing a black pigment.

It is necessary to reduce the size of the pattern of the light shielding film when forming a high definition pixel. However, it is considered difficult to perform fine processing of the light shielding film formed of the resin material. Although the light shielding film has a lattice-like pattern according to the arrangement of the sub-pixels, forming corner parts with a sharp angle is not easy, so the corner parts may have a dully curved shape, and the actual aperture may be reduced more than the design.

Further, the aperture ratio may be affected by an alignment error in bonding the counter substrate including the light shielding film and the array substrate including the pixel array. These problems may cause the aperture ratio of each sub-pixel to vary widely, which may lead to uneven color balance for each panel.

As will be described in detail below, in a display device according to an embodiment of the present invention, the aperture ratio may be precisely controlled even when forming high definition pixels.

1. Configuration of Display Device (First Substrate)

FIG. 1 is a cross-sectional view showing an outline of each layer arranged on a first substrate SUB1 constituting a display device 100 according to an embodiment of the present invention. As shown in FIG. 1, the first substrate SUB1 is arranged with a first transistor Tr1, a second transistor Tr2, a data signal line DL, a first wiring W1, a second wiring W2, a connection electrode ZTCO, a pixel electrode PTCO, a common auxiliary electrode CMTL, and a common electrode CTCO. Although the symbol TCO has no particular meaning, it may be used herein to refer to a transparent conductive oxide such as ITO, ZnO, IZO, or the like. The first transistor Tr1 is an element included in the pixel PX of the display device 100, and the second transistor Tr2 is an element included in the driver circuit. Although the details will be described later, the driver circuit is a circuit for driving the pixel PX.

1.1 First Transistor

The first transistor Tr1 includes a semiconductor layer OS, a gate insulating layer GI1, and a gate electrode GL1. The semiconductor layer OS is, for example, an oxide semiconductor layer. The semiconductor layer OS may be a polycrystalline silicon layer. The gate electrode GL1 faces the semiconductor layer OS. The gate insulating layer GI1 is arranged between the semiconductor layer OS and the gate electrode GL1. Although FIG. 1 shows an example of a top gate transistor in which the semiconductor layer OS is arranged on the substrate SUB side of the gate electrode GL1, a bottom gate transistor in which the positional relationship between the gate electrode GL1 and the semiconductor layer OS is reversed may be used.

The semiconductor layer OS includes a first semiconductor region OS1 and a second semiconductor region OS2. The first semiconductor region OS1 is a region where the semiconductor layer OS overlaps the gate electrode GL1, and corresponds to a region called a channel in the first transistor Tr1. A conductive state and a non-conductive state of the first transistor Tr1 are controlled according to a gate voltage applied to the gate electrode GL1. The second semiconductor region OS2 corresponds to a source region and a drain region. The second semiconductor region OS2 is continuous from the first semiconductor region OS1, and is also a region having electrical conductivity higher than that of the first semiconductor region OS1.

A second insulating layer IL2 is arranged on the gate electrode GL1. The data signal line DL is arranged on the second insulating layer IL2. The data signal line DL is connected to the second semiconductor region OS2 via an opening WCON arranged in the second insulating layer IL2 and the gate insulating layer GI1. The data signal line DL is a wire for transmitting a data signal related to the gradation of an image. A third insulating layer IL3 is arranged on the second insulating layer IL2 and the data signal line DL. The connection electrode ZTCO is arranged on the third insulating layer IL3. The connection electrode ZTCO is connected to the second semiconductor region OS2 via an opening ZCON arranged in the third insulating layer IL3, the second insulating layer IL2, and the gate insulating layer GI1. The connection electrode ZTCO is in contact with the second semiconductor region OS2 at the bottom of the opening ZCON. The connection electrode ZTCO is formed of a transparent conductive film.

A region where the connection electrode ZTCO and the second semiconductor region OS2 contact each other is referred to as a first contact region CON1. The connection electrode ZTCO is connected to the second semiconductor region OS2 in the first contact region CON1 arranged at a position which does not overlap the gate electrode GL1 and the data signal line DL in a plan view.

A fourth insulating layer IL4 is arranged on the connection electrode ZTCO. The fourth insulating layer IL4 is an insulating layer, also called a planarizing layer, and relaxes unevenness formed by the semiconductor layer OS, the gate electrode GL1, and the like arranged below the fourth insulating layer IL4. The pixel electrode PTCO is arranged on the fourth insulating layer IL4. The pixel electrode PTCO is connected to the connection electrode ZTCO via an opening PCON arranged in the fourth insulating layer IL4. A region where the connection electrode ZTCO and the pixel electrode PTCO contact each other is referred to as a second contact region CON2. The second contact region CON2 overlaps the gate electrode GL1 in a plan view. The pixel electrode PTCO is formed of a transparent conductive film.

A fifth insulating layer IL5 is arranged on the pixel electrode PTCO. The common auxiliary electrode CMTL and the common electrode CTCO are arranged on the fifth insulating layer IL5. The common auxiliary electrode CMTL and the common electrode CTCO have different planar patterns. The common auxiliary electrode CMTL is a metal layer. The common electrode CTCO is a transparent conductive layer. The electrical resistance of the common auxiliary electrode CMTL is lower than that of the common electrode CTCO. The common auxiliary electrode CMTL also functions as a light shielding layer, and for example, it is possible to suppress the occurrence of color mixing by shielding light from adjacent pixels. A plurality of first spacers SP1 are arranged on the common electrode CTCO.

The plurality of first spacers SP1 are arranged with a certain distance therebetween on the first substrate SUB1. The plurality of first spacers SP1 are not arranged corresponding to all the pixels, but are arranged in an area between a part of the pixels and pixels adjacent thereto. A height of each of the plurality of first spacers SP1 is half of a cell gap. A plurality of second spacers is also arranged on the second substrate SUB2. The plurality of second spacers of the second substrate SUB2 and the plurality of first spacers SP1 of the first substrate SUB1 are arranged to overlap each other in a plan view.

A first light shielding layer LS1 is arranged on the first substrate SUB1. The first light shielding layer LS1 is arranged in the region of the pixel PX. FIG. 1 shows the first light shielding layers LS1a, LS1b as the first light shielding layer LS1. The first light shielding layer LS1 may be composed of only the first light shielding layer LS1a or only the first light shielding layer LS1b. The first light shielding layer LS1 is arranged in a region where at least the gate electrode GL1 and the semiconductor layer OS overlap each other in a plan view. In other words, the first light shielding layer LS1 is arranged in a region overlapping the semiconductor layer OS in a plan view. The first light shielding layer LS1 prevents light incident from the side of the first substrate SUB1 from reaching the first semiconductor region OS1. The first light shielding layer LS1 defines an aperture range of the pixel PX. A voltage may be applied to the first light shielding layer LS1 when the first light shielding layer LS1 is formed of a conductive film. The first light shielding layer LS1 and the gate electrode GL1 may be electrically connected when a voltage is applied to the first light shielding layer LS1. The first contact region CON1 is arranged in a region which does not overlap the first light shielding layer LS1 in a plan view.

1-2. Second Transistor

The driver circuit includes the second transistors Tr2 (p-channel transistor Tr2-1 and n-channel transistor Tr2-2). Each of the p-channel transistor Tr2-1 and the n-channel transistor Tr2-2 includes a gate electrode GL2, a gate insulating layer GI2, and a semiconductor layer S. The semiconductor layer S includes a first semiconductor region S1, a second semiconductor region S2, and a third semiconductor region S3. The first semiconductor region S1 of the semiconductor layer S corresponds to a region for forming a channel, the second semiconductor region S2 corresponds to a region for forming a source region and a drain region, and the third semiconductor region S3 corresponds to a region for forming a lightly doped drain (LDD). The gate electrode GL2 includes a region overlapping the first semiconductor region S1. The gate insulating layer GI2 is arranged between the semiconductor layer S and the gate electrode GL2. FIG. 1 shows a bottom gate transistor in which the gate electrode GL2 is arranged on the first substrate SUB1 side of the semiconductor layer S in the second transistors Tr2 (p-channel transistor Tr2-1 and n-channel transistor Tr2-2). The second transistors Tr2 (p-channel transistor Tr2-1 and n-channel transistor Tr2-2), however, may be a top-gate transistor in which the positional relationship between the semiconductor layer S and the gate electrode GL2 is reversed.

The p-channel transistor Tr2-1 includes the first semiconductor region S1 and the second semiconductor region S2. The n-channel transistor Tr2-2 includes the first semiconductor region S1, the second semiconductor region S2, and the third semiconductor region S3. The first semiconductor region S1 overlaps the gate electrode GL2 in a plan view, and functions as a channel of the p-channel transistor Tr2-1 and the n-channel transistor Tr2-2, and the second semiconductor region S2 functions as a source region and a drain region. The third semiconductor region S3 of the n-channel transistor Tr2-2 has a higher resistance than that of the second semiconductor region S2 and is also called a lightly doped drain (LDD), and has a function of preventing hot carrier degradation.

The first insulating layer IL1 and the gate insulating layer GI1 are arranged on the semiconductor layer S. The gate insulating layer GI1 functions as an interlayer film for the p-channel transistor Tr2-1 and the n-channel transistor Tr2-2. The second wiring W2 is arranged on these insulating layers. The second wiring W2 is connected to the second semiconductor region S2 via openings arranged in the first insulating layer IL1 and the gate insulating layer GI1. The second insulating layer IL2 is arranged on the second wiring W2. The first wiring W1 is arranged on the second insulating layer IL2. The first wiring W1 is connected to the second wiring W2 through an opening arranged in the second insulating layer IL2.

The gate electrode GL2 and the first light shielding layer LS1a are the same layer. The second wiring W2 and the gate electrode GL1 are the same layer. Here, the same layer means that a plurality of members is simultaneously formed by patterning one layer (formed by the same etching process).

2. Partial Cross-Sectional Structure of the Pixel

Figure 2:
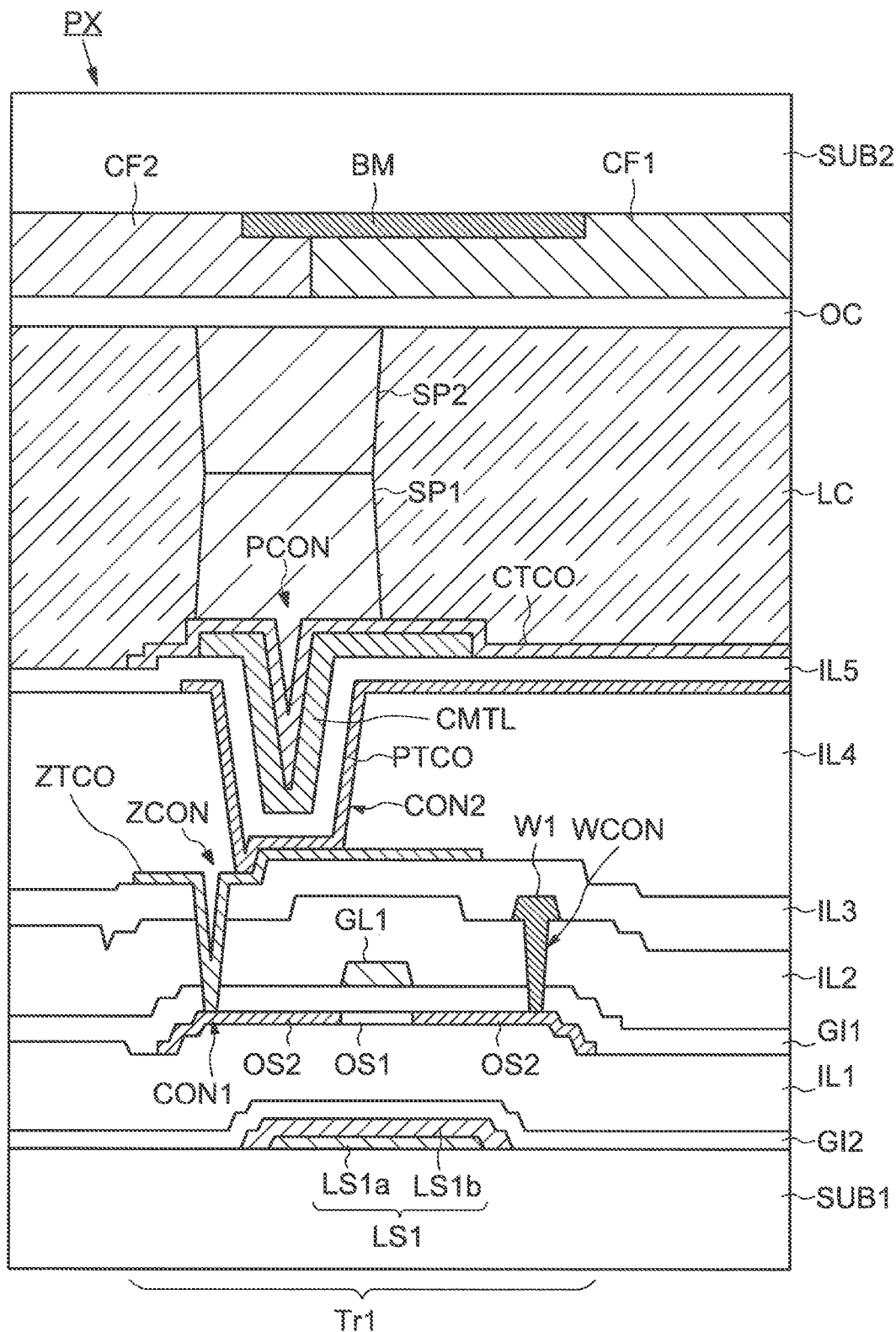
FIG. 2 is a cross-sectional view of a pixel of a display device according to an embodiment of the invention.

FIG. 2 shows an example of a partial cross-sectional structure of the pixel PX. The pixel PX includes the first substrate SUB1, the second substrate SUB2, and the liquid crystal layer LC between the first substrate SUB1 and the second substrate SUB2. As described with reference to FIG. 1, the first substrate SUB1 includes the first light shielding layer LS1, the first transistor Tr1, the connection electrode ZTCO, the pixel electrode PTCO, and the common electrode CTCO. The second substrate SUB2 includes the second light shielding layer BM, a color filter layer CF (first color filter layer CF1, second color filter layer CF2), and an overcoat layer OC. As described above, the second substrate SUB2 is arranged with the second spacers SP2 at the position corresponding to the first spacers SP1. The distance (cell gap) between the first substrate SUB1 and the second substrate SUB2 is held at a fixed distance by the first spacers SP1 and the second spacers SP2. It should be noted that, in addition to the above configuration, a configuration in which the first spacers SP1 directly contacts a layer (for example, an orientation film) forming the outermost surface of the second substrate SUB2 can also be adopted, and a configuration in which the second spacers SP2 directly contacts a layer forming the outermost surface of the first substrate SUB1 can also be adopted. Even in such a case, the second contact region CON2 is filled with the material forming the first spacers SP1, and the second contact region CON2 is planarized.

As shown in FIG. 2, a configuration lower than the liquid crystal layer LC, that is, the first substrate SUB1 and each configuration laminated on the first substrate SUB1 may be referred to as an array substrate. Similarly, the structure of the layer above the liquid crystal layer LC, that is, the second substrate SUB2 and the structures laminated on the second substrate SUB2 may be referred to as a counter substrate.

The second light shielding layer BM is formed of an organic resin material containing, for example, a black pigment. The second light shielding layer BM is arranged in the boundary region of the pixel PX. The second light shielding layer BM is arranged in a boundary region between the first color filter layer CF1 and the second color filter layer CF2. The first color filter layer CF1 and the second color filter layer CF2 are colored in a predetermined color and have translucency, and are colored in different hues. The overcoat layer OC is arranged on the color filter layer CF. The liquid crystal layer LC is arranged between the first substrate SUB1 (array substrate) and the second substrate SUB2 (counter substrate). In other words, the liquid crystal layer LC is arranged between the first light shielding layer LS1 and the second light shielding layer BM. Note that FIG. 2 shows an alignment film for defining an initial alignment state of the liquid crystal layer LC, which is omitted.

3. Planar Layout of Pixels

Figure 3:
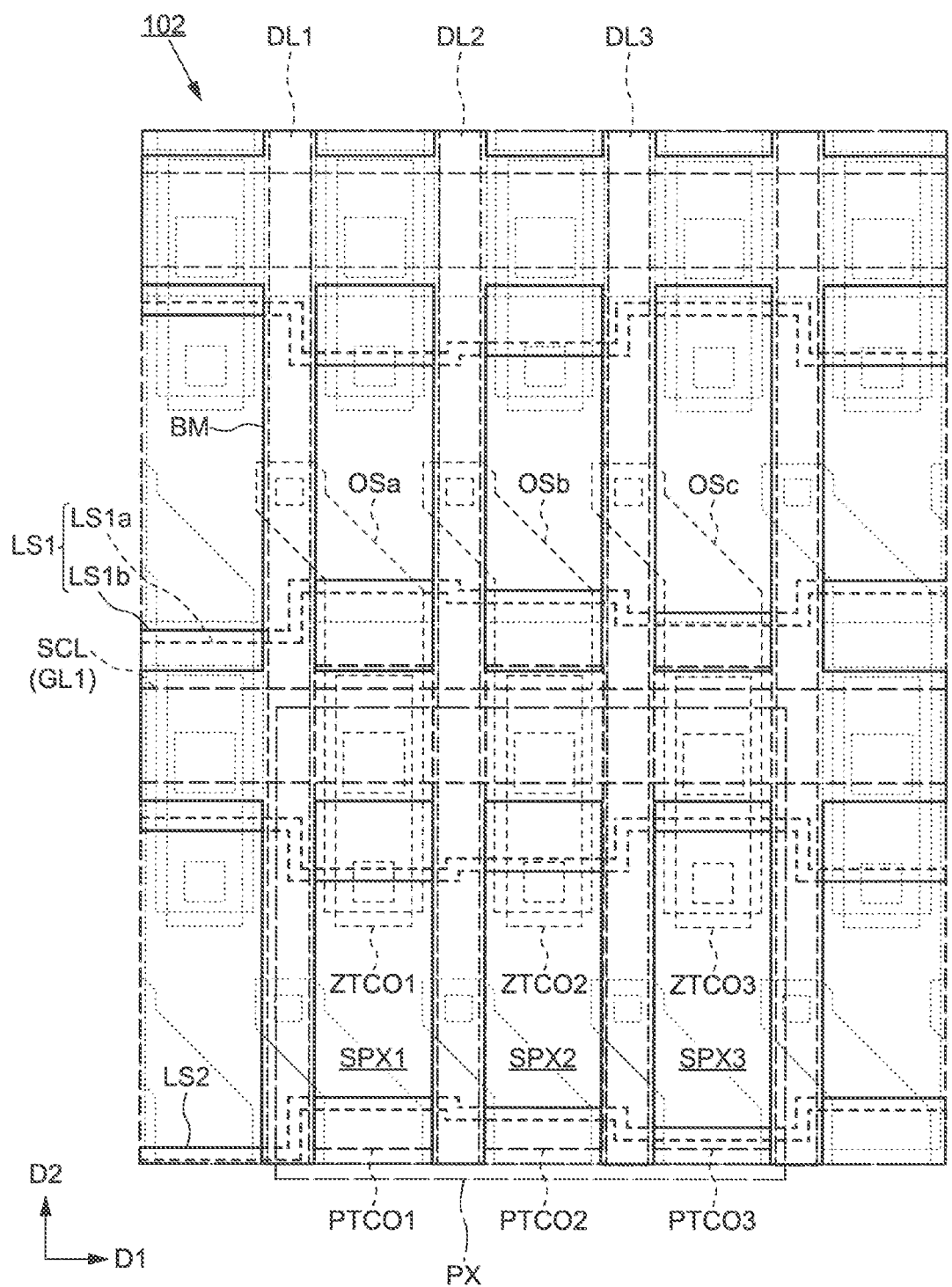
FIG. 3 is a plan view of the pixel part of a display device according to an embodiment of the invention.

The display device 100 has a pixel part 102 in which the plurality of pixels PX including the elements shown in FIG. 2 are arranged. FIG. 3 shows a planar schematic structure of the pixel part 102 when viewed from the second substrate SUB2 side. FIG. 3 shows an embodiment in which the pixel PX includes a first sub-pixel SPX1, a second sub-pixel SPX2, and a third sub-pixel SPX3. For example, the first sub-pixel SPX1 is a sub-pixel corresponding to blue color, the second sub-pixel SPX2 is a sub-pixel corresponding to green color, and the third sub-pixel SPX3 is a sub-pixel corresponding to red color. Colors in sub-pixels can be changed, for example, the first sub-pixel SPX1 may have red and the third sub-pixel SPX3 may have blue.

FIG. 3 shows that the first sub-pixel SPX1, the second sub-pixel SPX2, and the third sub-pixel SPX3 are arranged in the first direction D1. The pixels PX including the sub-pixels having the same configuration as the first sub-pixel SPX1, the second sub-pixel SPX2, and the third sub-pixel PX3 are arranged in a first direction D1 and a second direction D2 intersecting the first direction D1.

The first sub-pixel SPX1 includes a first semiconductor layer OSa, a first connection electrode ZTCO1, and a first pixel electrode PTCO1, the second sub-pixel SPX2 includes a second semiconductor layer OSb, a second connection electrode ZTCO2, and a second pixel electrode PTCO2, and the third sub-pixel SPX3 includes a third semiconductor layer OSc, a third connection electrode ZTCO3, and a third pixel electrode PTCO3. The first pixel electrode PTCO1, the second pixel electrode PTCO2, and the third pixel electrode PTCO3 are surrounded by the first light shielding layers LS1, LS2, and the second light shielding layer BM in a plan view, respectively, and a region (a region surrounded by the light shielding layer) exposed from these light shielding layers in a plan view becomes a light transmitting region. The first sub-pixel SPX1, the second sub-pixel SPX2, and the third sub-pixel SPX3 are defined with apertures (translucent regions) by the first light shielding layers LS1, LS2 and the second light shielding layer BM.

The scanning signal lines SCL extending in the first direction D1 and the data signal lines DL (the first data signal line DL1, the second data signal line DL2, and the third data signal line DL3) extending in the second direction D2 are arranged in the pixel part 102. One of the scanning signal lines SCL is arranged to intersect with the first semiconductor layer OSa, the second semiconductor layer OSb, and the third semiconductor layer OSc, and the intersecting part functions as a gate electrode (GL1). The scanning signal lines SCL and the data signal lines DL (first data signal line DL1, second data signal line DL2, and third data signal line DL3) shown in FIG. 3 are arranged between the first light shielding layer LS1 and the second light shielding layer BM in cross sectional views, as is apparent when compared with FIG. 2.

The first light shielding layer LS1 has a pattern extending in the first direction D1. The first light shielding layer LS1 is arranged at a position overlapping the scanning signal lines SCL extending in the first direction D1. A width of the scanning signal line SCL is smaller than a width of the first light shielding layer LS1. The scanning signal lines SCL is arranged in a region inside the pattern of the first light shielding layer LS1. The light shielding layer LS1 is arranged to intersect with the first semiconductor layer OSa, the second semiconductor layer OSb, and the third semiconductor layer OSc. The first light shielding layers LS1, LS2 may have a two-layer structure that may include the first light shielding layer LS1a as a lower layer and the first light shielding layer LS1b as a upper layer. A width of the first light shielding layer LS1b is wider than a width of the first light shielding layer LS1a. The first light shielding layer LS1a and the second light shielding layer LS1b are each formed of a metal film, and a width of the upper first light shielding layer LSb is larger than a width of the first light shielding layer LSa. In other words, it is preferable that the first light shielding layer LS1 has a structure in which at least two metal films are laminated, and the width of the upper metal layer is larger than the width of the lower metal layer. Both end parts defining the width of the first light shielding layer LS1 overlap with the first pixel electrodes PTCO1, the second pixel electrodes PTCO2, and the third pixel electrodes PTCO3 arranged along the first direction D1. The first light shielding layer LS2 adjacent to the first light shielding layer LS1 has the same pattern of the first light shielding layer LS1 (FIG. 3 shows a part thereof) and is arranged so that an end part in the width direction overlaps the first pixel electrodes PTCO1, the second pixel electrodes PTCO2, and the third pixel electrodes PTCO3. In other words, the first pixel electrodes PTCO1, the second pixel electrodes PTCO2, and the third pixel electrodes PTCO3 are arranged so that both ends along the first direction D1 overlap the first light shielding layers LS1, LS2.

The second light shielding layer BM includes a pattern extending in the second direction D2. The second light shielding layer BM has a shape overlapping the first data signal line DL1, the second data signal line DL2, and the third data signal line DL3 extending in the second direction D2 in a plan view. The second light shielding layer BM is arranged so that parts along the second direction D2 overlaps one end of the first semiconductor layer OSa, the second semiconductor layer OSb, and the third semiconductor layer OSc. Further, the second light shielding layer BM may include a pattern extending in the first direction D1 and overlapping the scanning signal lines SCL. The pattern extending in the first direction D1 is a continuous pattern with the pattern extending in the second direction D2, and is connected to the patterns extending in the adjacent second direction D2. Part of the second light shielding layer BM extending in the first direction D1 (pattern extending in the first direction D1) overlaps the scanning signal lines SCL and the first light shielding layers LS1, LS2, and has a width narrower than the first light shielding layers LS1, LS2. The second light shielding layer BM is arranged to overlap both sides along the second direction D2 of the first pixel electrodes PTCO1, the second pixel electrodes PTCO2, and the third pixel electrodes PTCO3.

As described above, the first pixel electrodes PTCO1, the second pixel electrodes PTCO2, and the third pixel electrodes PTCO3 are surrounded while partially overlapping the first light shielding layers LS1, LS2, and the second light shielding layer BM in a plan view. Here, an area of a region where the first light shielding layers LS1, LS2 overlap one of the first pixel electrodes PTCO1 is different from an area of a region where the first light shielding layers LS1, LS2 overlap one of the second pixel electrodes PTCO2 and one of the third pixel electrodes PTCO3. Specifically, the area where the first light shielding layers LS1, LS2 overlap the one of first pixel electrodes PTCO1 is larger than the area where the first light shielding layers LS1, LS2 overlap one of the second pixel electrodes PTCO2 and one of the third pixel electrodes PTCO3. The area where the first light shielding layers LS1, LS2 overlap one of the second pixel electrodes PTCO2 is smaller than the area where the first light shielding layers LS1, LS2 overlap one of the first pixel electrodes PTCO1 and larger than the area where the first light shielding layers LS1, LS2 overlap one of the third pixel electrodes PTCO3. The area where the first light shielding layers LS1, LS2 overlap one of the third pixel electrodes PTCO3 is smaller than the area where the first light shielding layers LS1, LS2 overlap one of the first pixel electrodes PTCO1 and one of the second pixel electrodes PTCO2.

Figure 4:
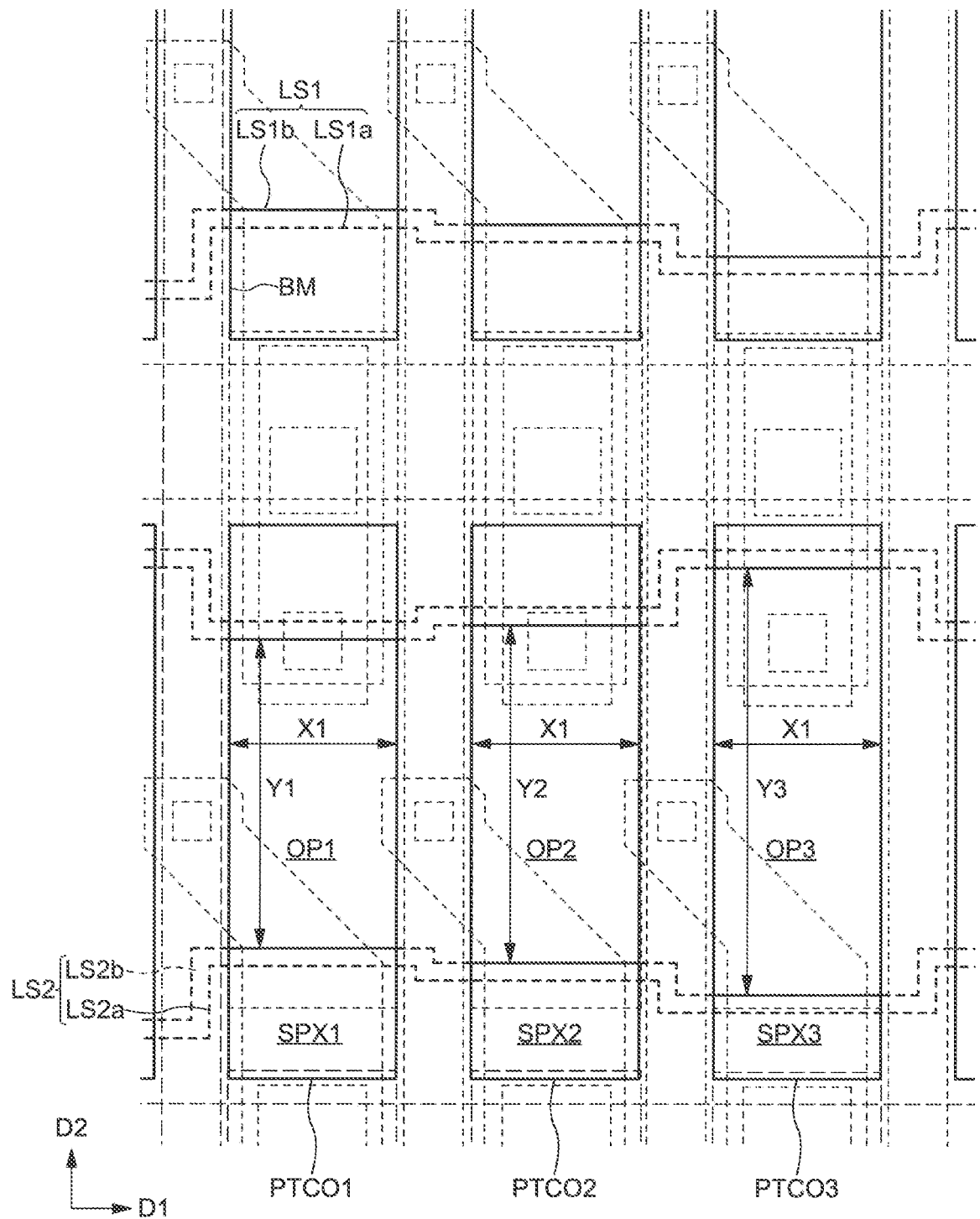
FIG. 4 is a plan view of the first sub-pixel, second sub-pixel, and third sub-pixel of a display device according to an embodiment of the invention.

FIG. 4 is an enlarged view of the first sub-pixel SPX1, the second sub-pixel SPX2, and the third sub-pixel SPX3. The first pixel electrode PTCO1, the second pixel electrode PTCO2, and the third pixel electrode PTCO3 partially overlapped and surrounded by the first light shielding layers LS1, LS2, and the second light shielding layer BM in a plan view. The first sub-pixel SPX1 has a first aperture OP1 exposed from the first light shielding layers LS1, LS2, the second sub-pixel SPX2 has a second aperture OP2, and the third sub-pixel SPX3 has a third aperture OP3.

The sizes (areas) of the first aperture OP1, the second aperture OP2, and the third aperture OP3 are different because the widths of the first light shielding layers LS1, LS2 are different for each aperture. That is, while the width X1 of the first sub-pixel SPX1, the second sub-pixel SPX2, and the third sub-pixel SPX3 in the first direction D1 is the same for the three pixels, the width in the second direction D2 has the relationship Y1<Y2<Y3 when the first sub-pixel SPX1 has the length Y1, the second sub-pixel SPX2 has the length Y2, and the third sub-pixel SPX3 has the length Y3. The difference in the length in the second direction D2 in each sub-pixel is based on the difference in the widths (or the length in the second direction D2) of the first light shielding layers LS1, LS2. The first light shielding layers LS1, LS2 have a part corresponding to the first sub-pixel SPX1 having a large width, a part corresponding to the third sub-pixel SPX3 having a small width, and a part corresponding to the second sub-pixel SPX2 having an intermediate width.

In this way, the width of one or both of the first light shielding layers LS1, LS2 sandwiching the first sub-pixel SPX1, the second sub-pixel SPX2, and the third sub-pixel SPX3 varies along the first direction D1, so that the area of the aperture of each pixel can be made different. That is, it is possible to make the aperture ratios of the first sub-pixel SPX1, the second sub-pixel SPX2, and the third sub-pixel SPX3 different by adjusting the widths of the first light shielding layer LS1 and the first light shielding layer LS2. Although this embodiment shows an example in which the widths of the first light shielding layers LS1, LS2 are different, the widths of the second light shielding layer BM may also be different at the same time. The aperture ratio refers to the ratio of the area not shielded by the light shielding layer to the area occupied by one pixel (or sub-pixel). The area of each pixel PX (or sub-pixel SPX) is determined, for example, according to the distance between the centers of adjacent scanning signal lines SCL and adjacent data signal lines DL, and has a size common to each sub-pixel regardless of color.

When the first sub-pixel SPX1 is a pixel corresponding to blue, the second sub-pixel SPX2 is a sub-pixel corresponding to green, and the third sub-pixel SPX3 is a sub-pixel corresponding to red, it is possible to increase the aperture ratio (or the area of the aperture) of the sub-pixel corresponding to red by the first light shielding layer LS1 in comparison with the aperture ratio (or the area of the aperture) of the sub-pixel corresponding to blue and the sub-pixel corresponding to green.

The pattern width of the first light shielding layers LS1, LS2 varies along the first direction D1 in order to make the size of the overlapping areas with each of the pixel electrodes arranged in the first direction D1 different.

Figure 5:
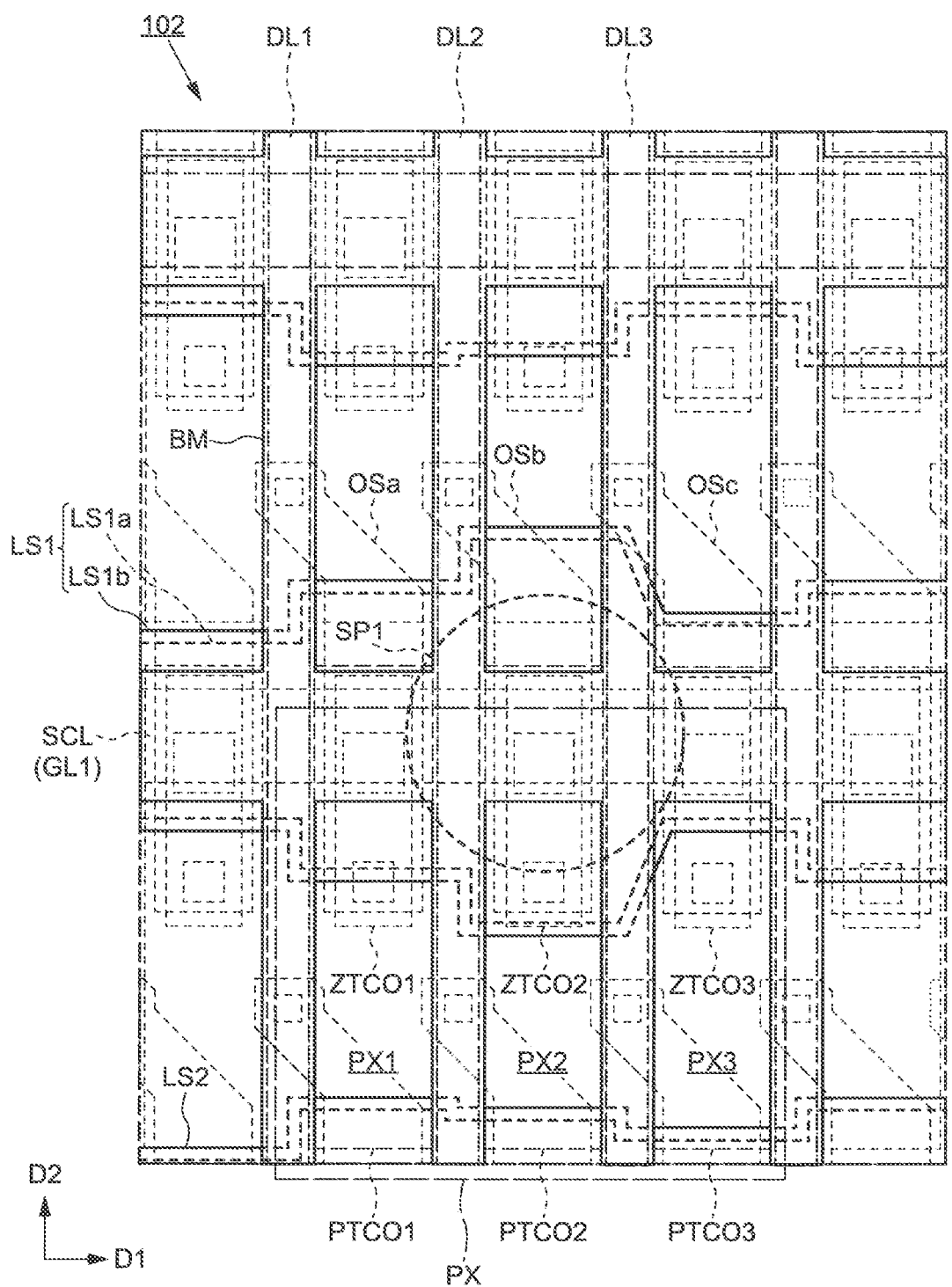
FIG. 5 is a plan view of a pixel part of a display device according to an embodiment of the invention.

The first light shielding layer LS1 is also utilized to shield the region of the spacer SP. FIG. 5 shows the pattern of the first light shielding layer LS1 in the region of the first spacer SP1. Although the first light shielding layer LS1 has a pattern the width of which changes at a certain manner along the first direction D1, it also has an irregular pattern in the region of the first spacer SP1. That is, the first light shielding layer LS1 has a pattern wider than other regions in order to shield the region of the first spacer SP1.

On the other hand, the second light shielding layer BM does not have an irregular pattern similar to the first light shielding layer SL1 even in the region where the first spacer SP1 is arranged, but has the same pattern as the other regions. Although a part of the first spacer SP1 is exposed from the second light shielding layer BM, since the first light shielding layer LS1 shields the first spacer SP1 from light, there is no influence on the display of the image. Since the second light shielding layer BM is formed of a resin material, it is difficult to form a fine and precise pattern. In order to shade the first spacer SP1 with the second shading layer BM, it is necessary to design a wide area of the shading part in consideration of the margin. On the other hand, according to the present embodiment, since the first light shielding layer LS1 has a fine pattern, the first spacer SP1 can be reliably shielded from light, and the aperture ratio of the pixel can be prevented from becoming smaller more than necessary. Therefore, according to the present embodiment, as shown in FIG. 5, a part of the first spacer SP1 is not shielded by the second light shielding layer BM when the relationship between the second light shielding layer BM and the first spacer SP1 is viewed. That is, the first spacer SP1 (or the whole of the spacer, which is formed by the first spacer SP1 and the second spacer SP2 in the present embodiment) has a lower bottom surface on the first substrate SUB1 side overlapping the entire first light shielding layer LS1 arranged on the first substrate SUB1, while an upper bottom surface on the second substrate SUB2 side is partially exposed from the second light shielding layer BM arranged on the second substrate SUB2. As shown in FIG. 5, the first spacer SP1 is not only arranged on the second contact region CON2 of a predetermined pixel, but also overlaps the pixel electrode PTCO over the second contact region CON2, the semiconductor layer OS connected to the pixel electrode PTCO, and the pixel electrode adjacent to the pixel electrode PTCO in the second direction D2. As described above, when a high definition pixel part 102 is formed, the spacer becomes relatively larger than the size of the pixel PX. In this embodiment, the radius of the first spacer SP1 is larger than the length in the first direction of the pixel PX defined between the centers of the data signal lines DL, and the first spacer SP1 overlaps any of the pair of adjacent data signal lines DL2, DL3.

A region where the first pixel electrode PTCO1 is exposed from the first light shielding layers LS1, LS2 and the second light shielding layer BM constitutes a light transmissive region. This light transmissive region corresponds to the aperture of the first sub-pixel SPX1. That is, the aperture ratio of the first sub-pixel SPX1 is defined by the first light shielding layers LS1, LS2 and the second light shielding layer BM. Similarly, the aperture ratios of the second sub-pixel SPX2 and the third sub-pixel SPX3 are also defined by the first light shielding layers LS1, LS2 and the second light shielding layer BM. The aperture ratios of the first sub-pixel SPX1, the second sub-pixel SPX2, and the third sub-pixel SPX3 are different. The difference in the aperture ratio of each pixel is defined by the difference in the area where the first light shielding layers LS1, LS2 overlap the pixel electrode.

It should be noted that the first light shielding layers LS1, LS2 are arranged on the first substrate SUB1, and the second light shielding layer BM is arranged on the second substrate SUB2. As shown in FIG. 1 and FIG. 2, the first light shielding layer LS1 is arranged on a lower layer side than the scanning signal line SCL (and the gate electrode GL1) and the pixel electrode PTCO. The first light shielding layer LS1 is formed with a metal film on the first substrate SUB1, and the above-described pattern is formed by a photolithography process. The first light shielding layer LS1 is a layer first patterned on the first substrate SUB1, and the scanning signal line SCL (and the gate electrode GL1) and the pixel electrode PTCO formed in the subsequent steps are positioned by alignment markers formed in the same layer as the first light shielding layer LS1. The first light shielding layer LS1 is formed by dry etching or wet etching a metal film which is an inorganic material, so that the first light shielding layer LS1 can be formed in a fine pattern. The pixel electrode PTCO has a transparent conductive film formed on the first substrate SUB1 formed in a predetermined shape through a photolithography process. The mutual positions of the first light shielding layer LS1 and the pixel electrode PTCO depend on the alignment accuracy of the photomask in the exposure apparatus and can be aligned with high accuracy. On the other hand, the second light shielding layer BM is formed of an organic resin material containing a black pigment. Although the second light shielding layer BM is not suitable for forming a high-definition pattern such as the first light shielding layer LS1, the second light shielding layer BM can be inexpensively manufactured in a region having a large area with a small number of steps.

If the aperture ratio of pixels is to be adjusted only with the second light shielding layer BM formed on the second substrate SUB2, a margin must be maintained to account for alignment accuracy (misalignment of lamination) when the first substrate SUB1 and second substrate SUM2 are bonded together. The display device 100 according to the present embodiment finely controls the aperture ratio of pixels by combining the above two kinds of light shielding layers. That is, not only the second light shielding layer BM arranged on the second substrate SUB2 defines the aperture ratio of the pixels, but also the first light shielding layer LS1 arranged on the first substrate SUB1 and the second light shielding layer BM arranged on the second substrate SUB2 are utilized, and the aperture area (at least with respect to the definition in the second direction) is controlled by the first light shielding layer LS1 to precisely control the aperture ratio of each pixel. Thus, even if the pixel is formed to a high definition (even if the size of the pixel is narrowed), the aperture ratio of the pixel can be precisely controlled.

4. Detailed Layout of Each Layer Constituting the Pixel

A detailed layout of each layer constituting the pixel PX will be described below.

4-1. First Light Shielding Layer

Figure 6:
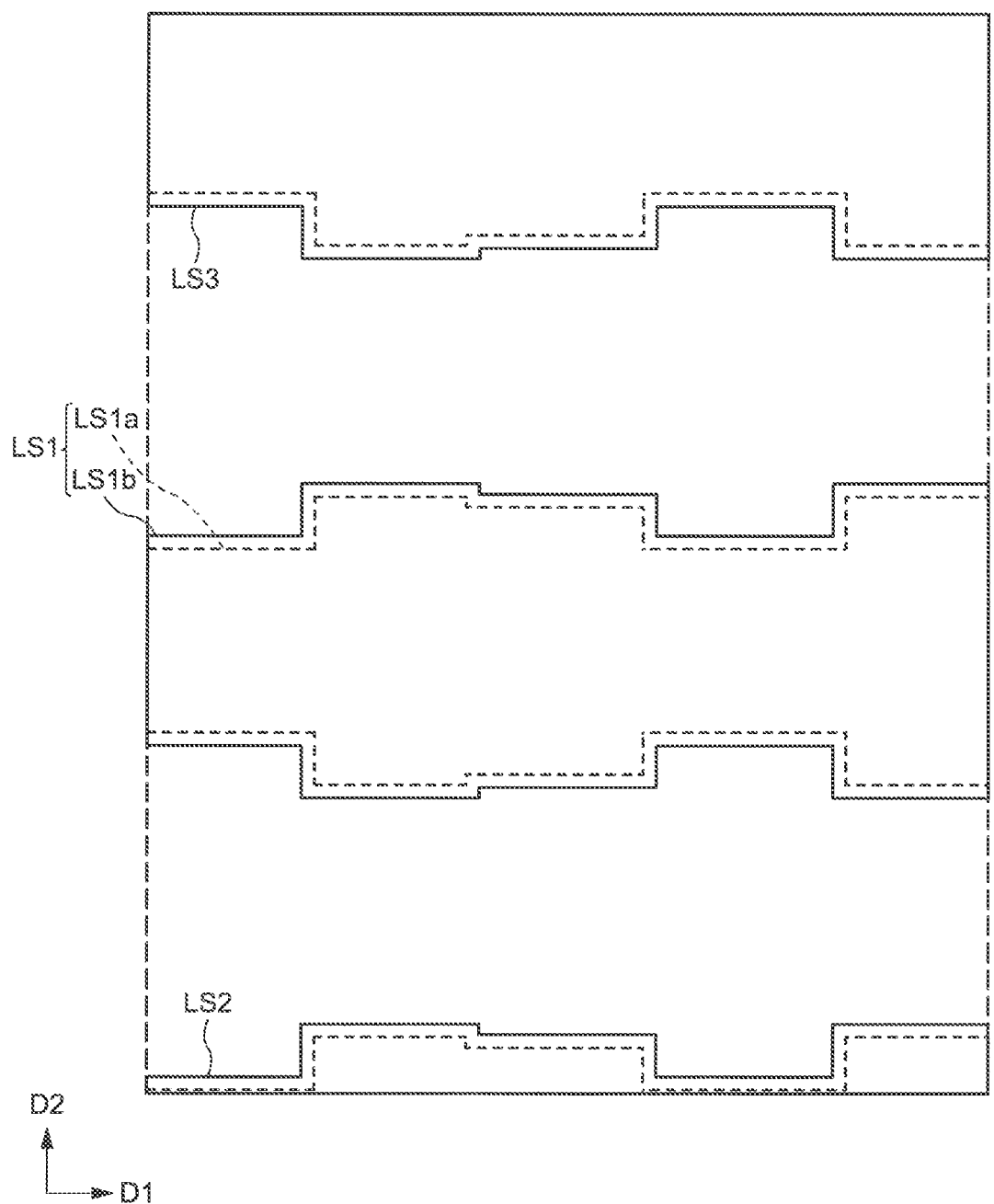
FIG. 6 is a plan view showing a configuration of a first light shielding layer arranged in a pixel part of a display device according to an embodiment of the present invention.

FIG. 6 shows the first light shielding layers LS1, LS2, LS3. The first light shielding layers LS1, LS2, LS3 have a pattern extending in the first direction D1. As described with reference to FIG. 3, the pattern width of the first light shielding layer LS1 is different according to the arrangement of the pixels. That is, the first light shielding layer LS1 includes a part having a wider width along the first direction D1 and a part having a narrower width than the part having a wider width. For example, when the first sub-pixel SPX1, the second sub-pixel SPX2, and the third sub-pixel SPX3 as shown in FIG. 3 are arranged periodically along the first direction D1, the first light shielding layer LS1 has a pattern that changes periodically. The same is true for the first light shielding layers LS2, LS3.

As shown in FIG. 1, the first light shielding layer LS1 may have a two-layer structure comprised of the first light shielding layer LS1a and the first light shielding layer LS1b. It is possible to enhance the light shielding performance by forming the first light shielding layer LS1 into a metal film with a two-layer structure.

4-2. Semiconductor Layer

Figure 7:
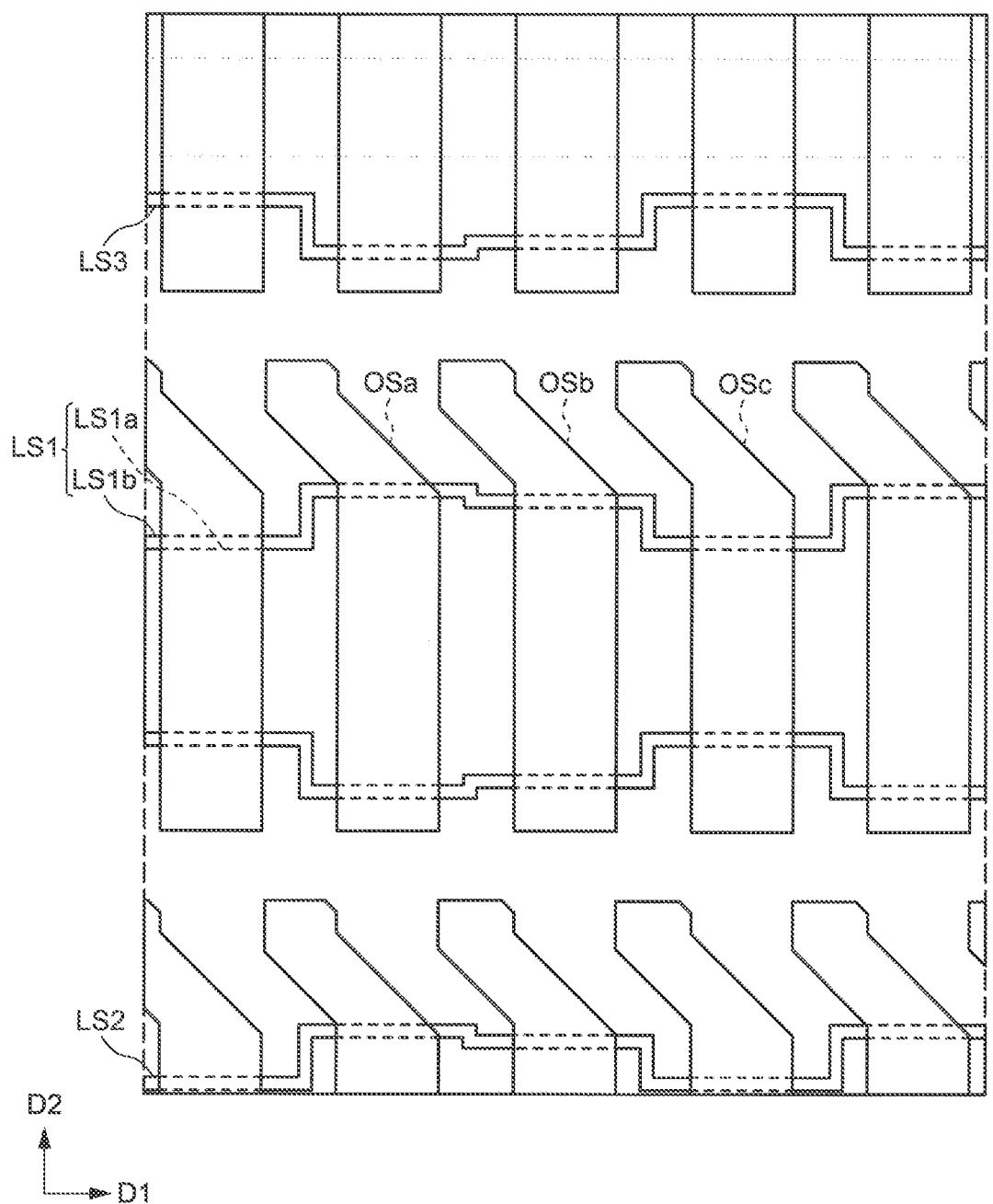
FIG. 7 is a plan view showing a configuration of a semiconductor layer arranged in a pixel part of a display device according to an embodiment of the present invention.

As shown in FIG. 7, the first semiconductor layer OSa, the second semiconductor layer OSb, and the third semiconductor layer OSc have island patterns extending in the second direction D2. The first semiconductor layer OSa, the second semiconductor layer OSb, and the third semiconductor layer OSc are arranged on the upper layer side of the first light shielding layer LS1. The first semiconductor layer OSa, the second semiconductor layer OSb, and the third semiconductor layer OSc are arranged so that they partially overlap the first light shielding layer LS1.

4-3. Scanning Signal Line

Figure 8:
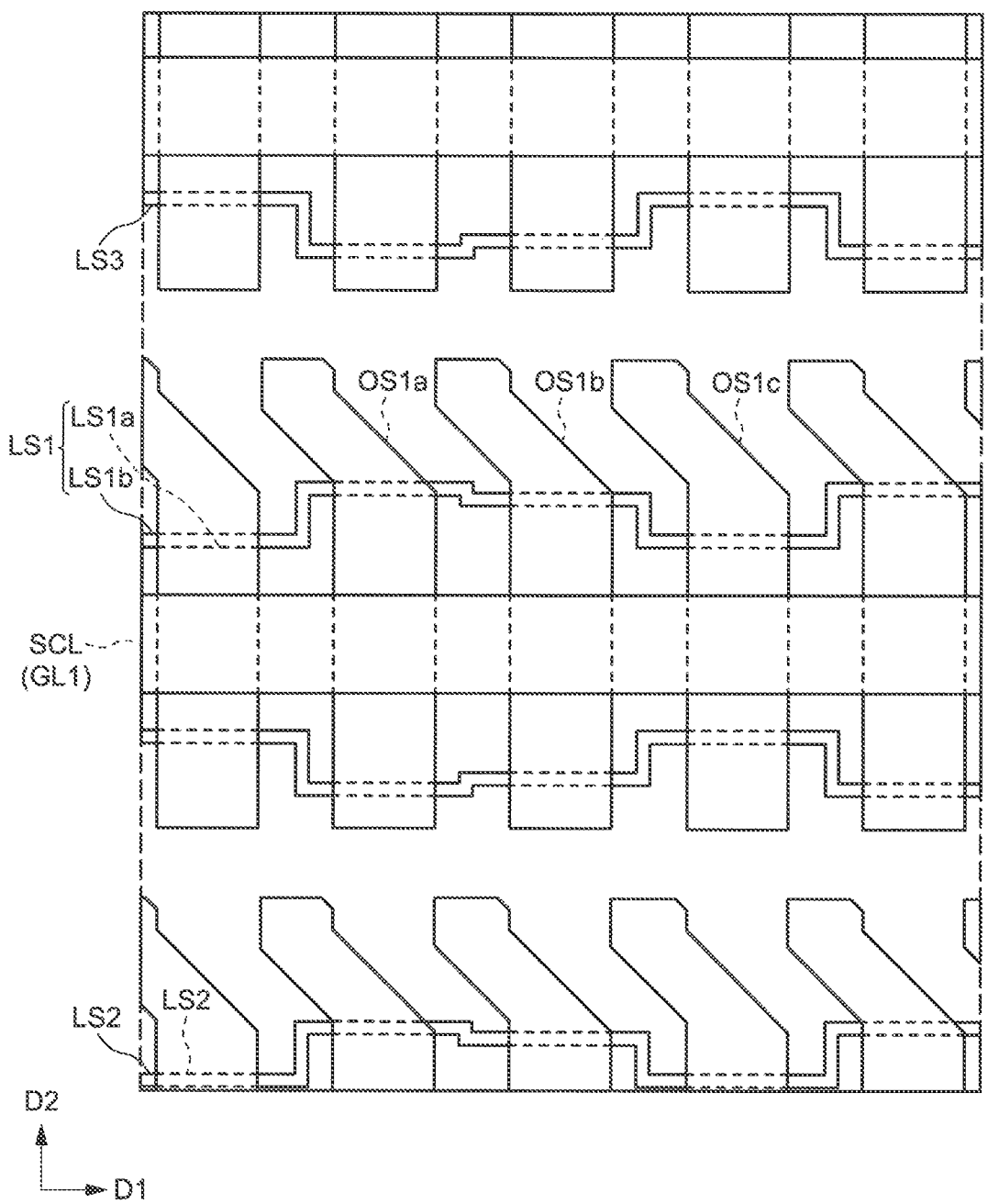
FIG. 8 is a plan view showing a configuration of a scanning signal line arranged in a pixel part of a display device according to an embodiment of the present invention.

FIG. 8 shows the scanning signal line SCL. The scanning signal line SCL extends in the first direction D1 to intersect with the first semiconductor layer OSa, the second semiconductor layer OSb, and the third semiconductor layer OSc. A part where the scanning signal line SCL intersects the first semiconductor layer OSa, the second semiconductor layer OSb, and the third semiconductor layer OSc functions as a gate electrode (GL1). The pattern of the scanning signal line SCL (gate electrode GL1) is arranged inside the pattern of the first light shielding layer LS1.

4-4. Data Signal Line

Figure 9:
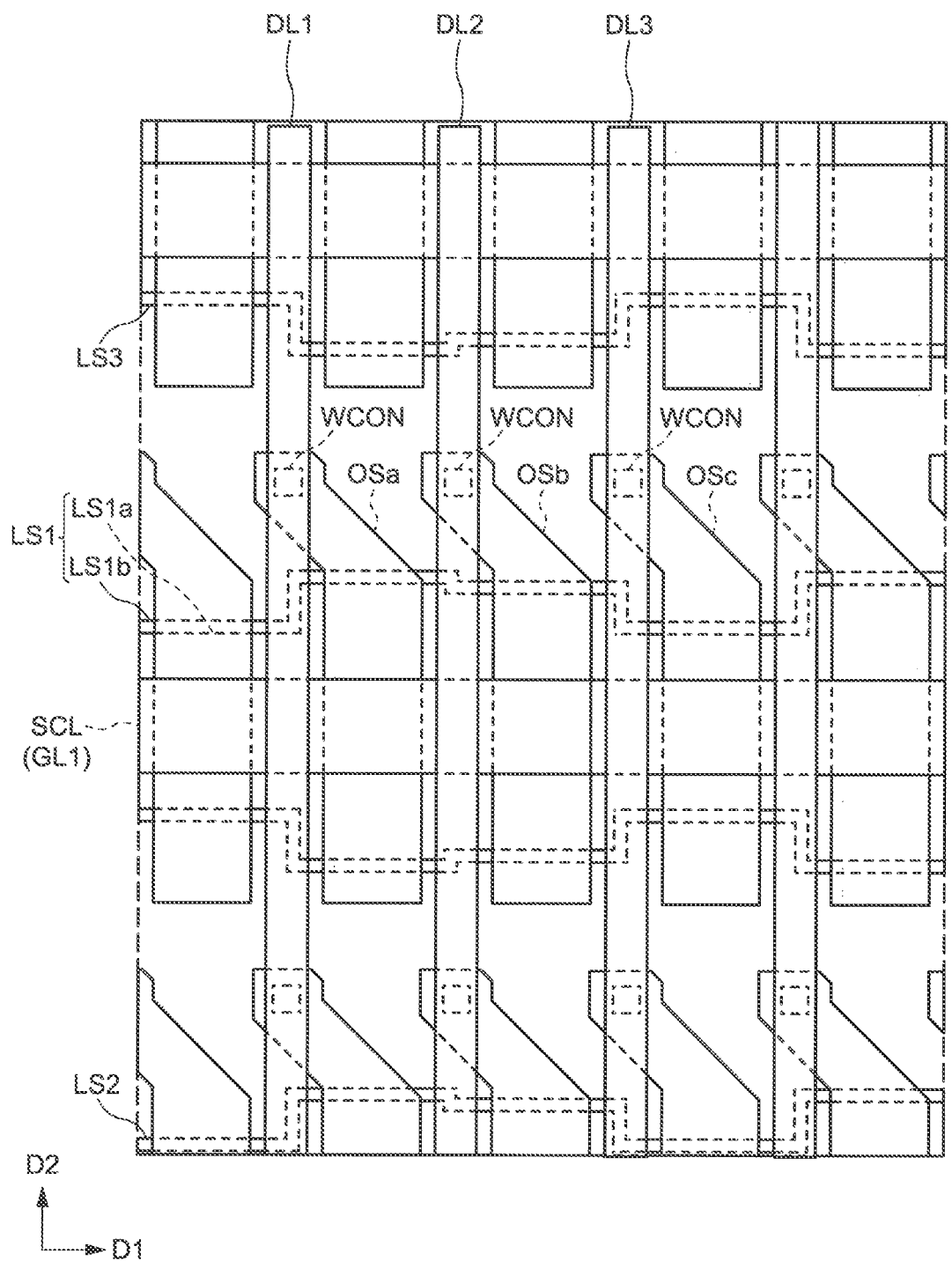
FIG. 9 is a plan view showing a configuration of a data signal line arranged in a pixel part of a display device according to an embodiment of the present invention.

FIG. 9 shows the first data signal line DL1, the second data signal line DL2, and the third data signal line DL3. The first data signal line DL1, the second data signal line DL2, and the third data signal line DL3 extend in the second direction D2 and are arranged to intersect the scanning signal line SCL. As shown in FIG. 9, the aperture WCON is arranged in a region overlapping the first data signal line DL1, the second data signal line DL2, and the third data signal line DL3 near one end of the island pattern of the first semiconductor layer OSa, the second semiconductor layer OSb, and the third semiconductor layer OSc. A main part of the first semiconductor layer OSa is arranged between the first data signal line DL1 and the second data signal line DL2 and extends in the second direction D2. One end of the first semiconductor layer OSa has a pattern bent toward the opening WCON from a part sandwiched between the first data signal line DL1 and the second data signal line DL2. The first data signal line DL1 is arranged to overlap the opening WCON. The first semiconductor layer OSa is connected to the first data signal line DL1 at the opening WCON. The same is true for the second semiconductor layer OSb and the third semiconductor layer OSc.

4-5. Connection Electrode

Figure 10:
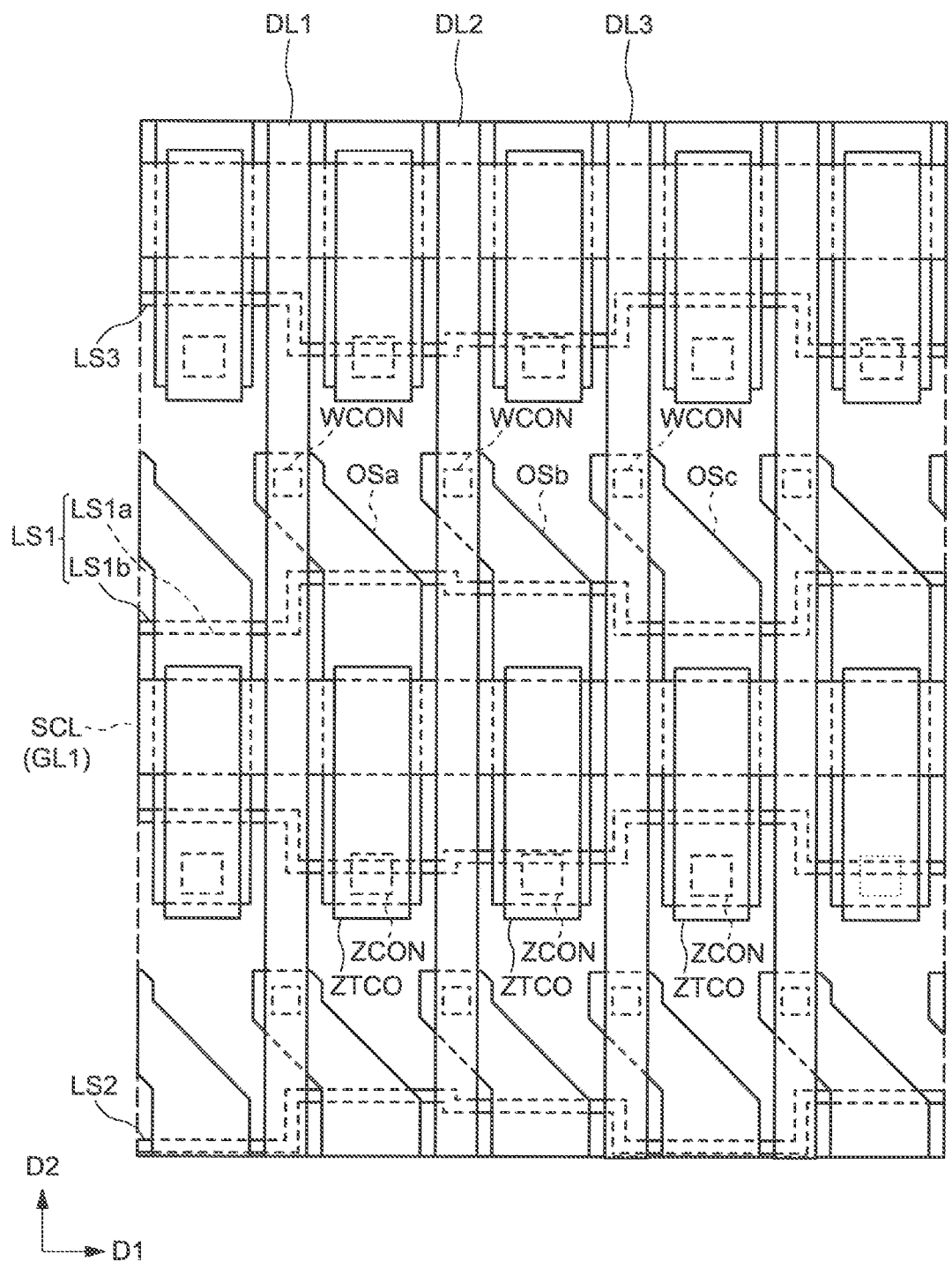
FIG. 10 is a plan view showing a configuration of a connection electrode arranged in a pixel part of a display device according to an embodiment of the present invention.

As shown in FIG. 10, the opening ZCON is arranged to overlap the island pattern of the first semiconductor layer OSa, the second semiconductor layer OSb, and the third semiconductor layer OSc. While the opening WCON is arranged on one end side of the first semiconductor layer OSa, the second semiconductor layer OSb, and the third semiconductor layer OSc, the opening ZCON is arranged on the other end side of the first semiconductor layer OSa, the second semiconductor layer OSb, and the third semiconductor layer OSc. The first light shielding layer LS1 or the scanning signal line SCL passes between one end and the other end of the first semiconductor layer OSa, the second semiconductor layer OSb, and the third semiconductor layer OSc. The opening ZCON is arranged at a position not overlapping the scanning signal line SCL.

The connection electrode ZTCO is arranged between the first data signal line DL1 and the second data signal line DL2 to overlap the first semiconductor layer OSa. The connection electrode ZTCO is connected to the first semiconductor layer OSa at the opening ZCON (first contact region CON1). The second semiconductor layer OSb and the third semiconductor layer OSc are similarly connected to the connection electrode ZTCO. The connection electrode ZTCO has a pattern extending along the second direction D2 and is arranged to extend from a part where the opening ZCON is formed to a region exceeding the scanning signal line SCL.

4-6. Pixel Electrode

Figure 11:
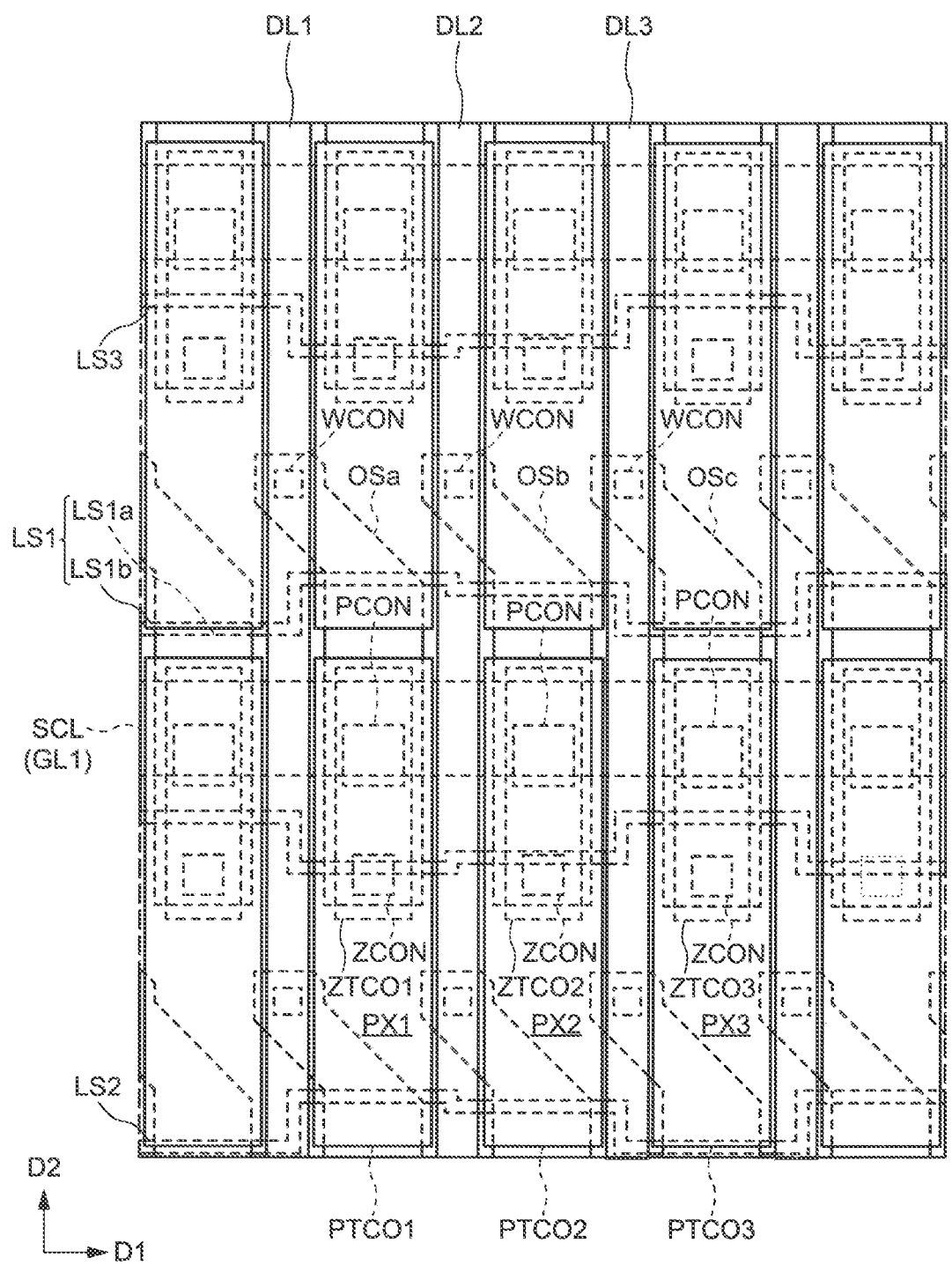
FIG. 11 is a plan view showing a configuration of a pixel electrode arranged in a pixel part of a display device according to an embodiment of the present invention.

FIG. 11 shows the first pixel electrode PTCO1, the second pixel electrode PTCO2, and the third pixel electrode PTCO3. The first pixel electrode PTCO1 is connected to the first connection electrode ZTCO1 through the opening PCON, the second pixel electrode PTCO2 is connected to the second connection electrode ZTCO2 through the opening PCON, and the third pixel electrode PTCO3 is connected to the third connection electrode ZTCO3 through the opening PCON. The opening PCON is arranged in a region near the upper ends of the patterns of the first connection electrode ZTCO1, the second connection electrode ZTCO2, and the third connection electrode ZTCO3 and overlaps the pattern of the scanning signal line SCL (gate electrode GL1). The first pixel electrode PTCO1 is arranged between the first data signal line DL1 and the second data signal line DL2 to overlap the scanning signal line SCL (gate electrode GL1), the semiconductor layer OS1a, and the first connection electrode ZTC1 and extend in the second direction D2. The same is true for the second pixel electrode PTCO2 and the third pixel electrode PTCO3.

4-7. Common Auxiliary Electrode

Figure 12:
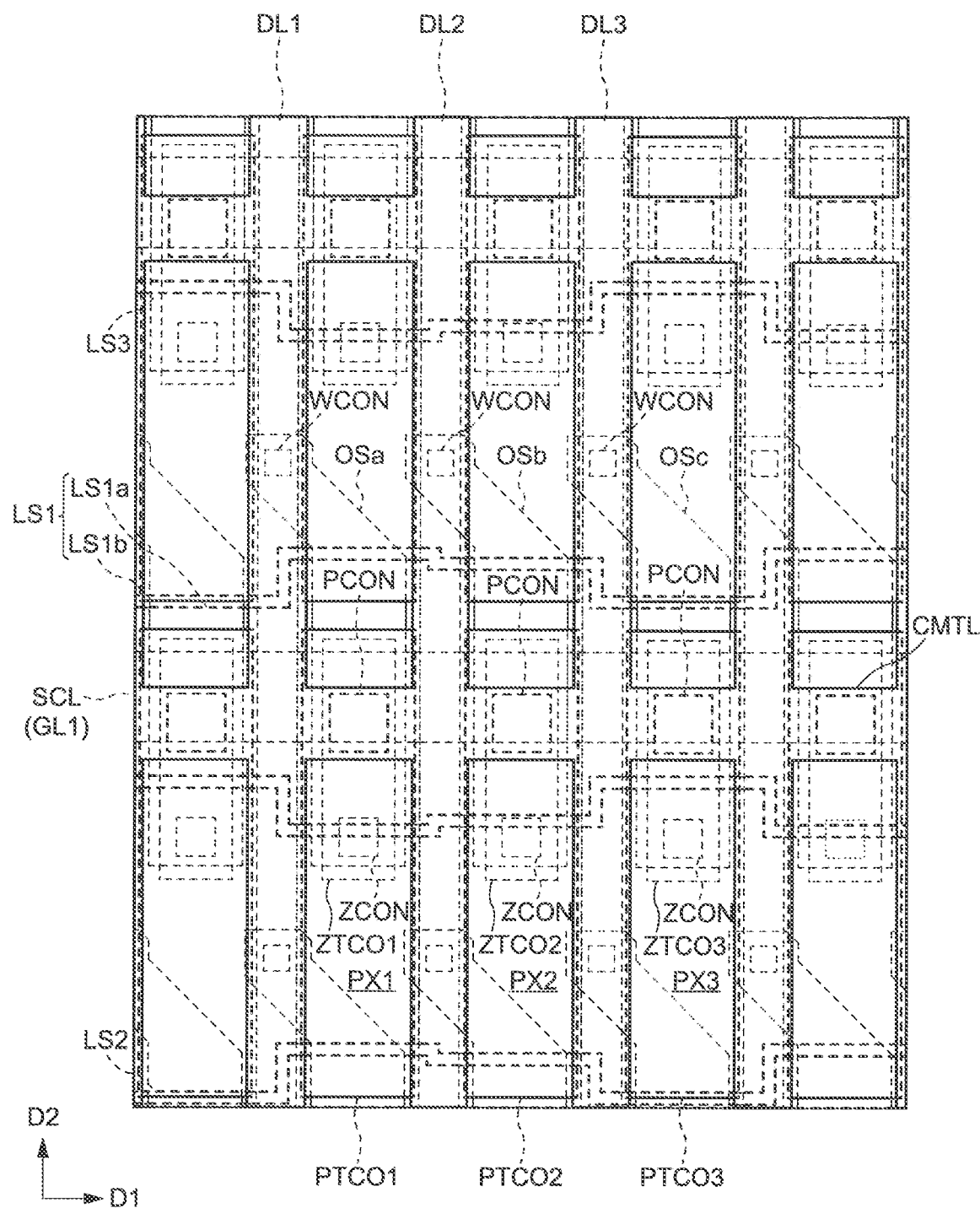
FIG. 12 is a plan view showing a configuration of a common auxiliary electrode arranged in a pixel part of a display device according to an embodiment of the present invention.

FIG. 12 shows a common auxiliary electrode CMTL. The common auxiliary electrode CMTL has a lattice-like pattern surrounding the first pixel electrode PTCO1, the second pixel electrode PTCO2, and the third pixel electrode PTCO3. The common auxiliary electrode CMTL includes a vertical pattern extending in the second direction D2 to overlap the first data signal line DL1, the second data signal line DL2, and the third data signal line DL3, and a horizontal pattern extending in the first direction D1 to overlap part of the opening PCON. A width of the pattern extending in the first direction D1 of the common auxiliary electrode CMTL is narrower than the width of the first light shielding layer LS1. The common auxiliary electrode CMTL is arranged over the entire pixel part 102. In other words, the common auxiliary electrode CMTL has a plurality of openings that expose the first pixel electrode PTCO1, the second pixel electrode PTCO2, and the third pixel electrode PTCO3.

The common auxiliary electrode CMTL is formed of a metal film. The common auxiliary electrode CMTL is utilized as an auxiliary electrode for reducing the resistance of the common electrode CTCO, which is formed of a transparent conductive film on the common electrode CMTL and extends over substantially the entire surface of the pixel part 102.

According to the above configuration, it is possible to define the aperture widths of the first pixel PX1, the second pixel PX2, and the third pixel PX3 in the first direction D1 by adjusting the widths of the common auxiliary electrodes CMTL. That is, it is possible to form a region overlapping the first pixel electrode PTCO1, the second pixel electrode PTCO2, and the third pixel electrode PTCO3 by widening the width of the common auxiliary electrode CMTL, and to add a function as a light shielding layer. In other words, the common auxiliary electrode CMTL can replace the function of the second light shielding layer BM arranged on the second substrate SUB2.

FIG. 3 shows an example in which the aperture of a pixel is defined by the first light shielding layer LS1 and the second light shielding layer BM, and as shown in FIG. 12, it is also possible to define the aperture size (aperture ratio) of the pixel by the first light shielding layer LS1 and the common auxiliary electrode CMTL. More specifically, the common auxiliary electrode CMTL is arranged to overlap each data signal line and extend in the second direction, and defines the width of the aperture of each pixel PX in the first direction instead of the second light shielding layer BM. Since the common auxiliary electrode CMTL is patterned by photolithography in the same manner as the first light shielding layer LS1, the aperture ratio can be precisely defined even if the pixel PX is reduced in size. According to such a configuration, the second light shielding layer BM on the counter substrate side (second substrate side SUB2) may or may not be arranged. The width of the horizontal pattern of the common auxiliary wiring CMTL in the second direction is equal to the width of the opening PCON, and the width is smaller than the widths of the first light shielding layers LS1, LS2 while covering the opening PCON.

4-8. Common Electrode

Figure 13:
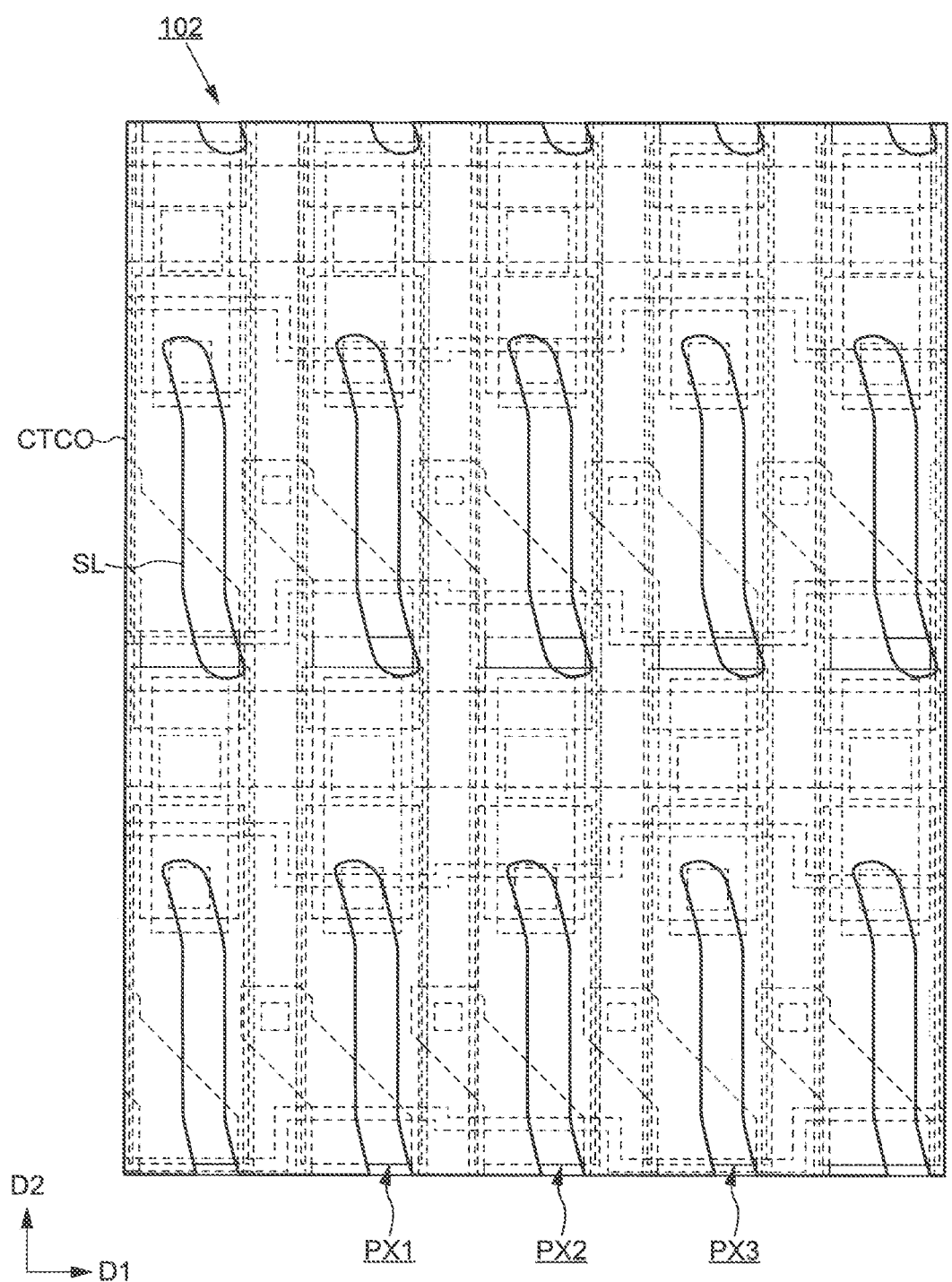
FIG. 13 is a plan view showing a configuration of a common electrode arranged in a pixel part of a display device according to an embodiment of the present invention.

FIG. 13 shows the common electrode CTCO. The common electrode CTCO is commonly arranged for a plurality of pixels. The common electrode CTCO is provided with slits SL in a region corresponding to the aperture of the first pixel PX1, the second pixel PX2, and the third pixel PX3. The slit SL has a curved shape (a vertically long S-shape), and has a shape in which the width in the extending direction decreases as the tip ends. As described above, the pixel PX driving the liquid crystal in the IPS mode (In-Plane Switching mode) or FFS mode (Fringe Field Switching mode) is provided.

4-9. Material of Each Member Constituting the Pixel

A rigid substrate having translucency and no flexibility such as a glass substrate, a quartz substrate and a sapphire substrate can be used as the first substrate SUB1 and the second substrate SUB2. On the other hand, when the first substrate SUB1 and the second substrate SUB2 require flexibility, a flexible substrate containing a resin such as a polyimide substrate, an acrylic substrate, a siloxane substrate, or a fluor resin substrate can be used as the substrate. In order to improve the heat resistance of the first substrate SUB1 and the second substrate SUB2, impurities may be introduced into the resin.

A metal can be used as the scanning signal line SCL (gate electrode GL1), the gate electrode GL2, the data signal line DL, the first wiring W1, the second wiring W2, the first light shielding layer LS1, and the common auxiliary electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), and alloys or compounds thereof are used as these members. The material of these members may be used as a single layer or may be used as a laminate.

An insulating material can be used as the gate insulating layers GI1, GI2, the first insulating layer IL1, the second insulating layer IL2, the third insulating layer IL3, the fourth insulating layer IL4, and the fifth insulating layer IL5. For example, an inorganic insulating material such as silicon oxide ($SiO_x$), silicon oxynitride ($SiO_xN_y$), silicon nitride ($Si_xNy$), aluminum oxide ($AlO_x$), aluminum oxynitride ($AlO_xN_y$), and aluminum nitride ($AlN_x$) can be used as the first insulating layer IL1, the second insulating layer IL2, the third insulating layer IL3, and the fifth insulating layer IL5. These insulating layers preferably contain few defects. An organic insulating material such as a polyimide resin, an acrylic resin, an epoxy resin, a silicone resin, a fluor resin, or a siloxane resin can be used as the fourth insulating layer IL4. An organic insulating material may be used as the gate insulating layers GI1, GI2, the first insulating layer IL1, the second insulating layer IL2, the third insulating layer IL3, and the fifth insulating layer IL5. The material of these members may be used as a single layer or may be used as a laminate.

As an example of the insulating layer, $SiO_x$ having a thickness of 100 nm is used as the gate insulating layer GI1. $SiO_x/Si_xN_y/SiO_x$ having a total thickness of 600 nm to 700 nm is used as the first insulating layer IL1. $SiO_x/Si_xN_y$ having a total thickness of 60 nm to 100 nm is used as the gate insulating layer GI2. $SiO_x/Si_xN_y/SiO_x$ with a total thickness of 300 nm to 500 nm is used as the second insulating layer IL2. $SiO_x$ (single layer), $Si_xN_Y$ (single layer), or their laminations having a total thickness of 200 nm to 500 nm are used as the third insulating layer IL3. An organic layer having a thickness of 2 μm to 4 μm is used as the fourth insulating layer IL4. $Si_xN_y$ (single layer) having a thickness of 50 nm to 150 nm is used as the fifth insulating layer IL5.

A metal oxide (oxide semiconductor) having semiconductor properties can be used as the semiconductor layer OS. The semiconductor layer OS has transparency. For example, oxide semiconductors containing indium (In), gallium (Ga), zinc (Zn), and oxygen (O) can be used. In particular, an oxide semiconductor having a composition ratio of In:Ga:Zn:O=1:1:1:4 can be used. However, the oxide semiconductor containing In, Ga, Zn, and O used in this embodiment is not limited to the above composition, and an oxide semiconductor having a composition different from the above may be used. For example, the ratio of In may be larger than the above in order to improve the mobility. In order to increase the band gap and reduce the influence of light irradiation, the ratio of Ga may be made larger than the above.

The oxide semiconductor containing In, Ga, Zn and O may be doped with other elements. For example, metal elements such as Al and Sn may be added to the oxide semiconductor. In addition to the oxide semiconductors described above, oxide semiconductors including In and Ga (IGO), oxide semiconductors including In and Zn (IZO), oxide semiconductors including In, Sn and Zn (ITZO), and oxide semiconductors including In and W may be used as the semiconductor layer OS. The semiconductor layer OS may be amorphous or crystalline. The semiconductor layer OS may be a mixed phase of amorphous and crystal.

A transparent conductive layer is used as the connection electrode ZTCO, the pixel electrode PTCO (first pixel electrode PTCO1, second pixel electrode PTCO2, and third pixel electrode PTCO3), and the common electrode CTCO. A mixture of indium oxide and tin oxide (ITO) and a mixture of indium oxide and zinc oxide (IZO) can be used as the transparent conductive layer. Materials other than those described above may be used as the transparent conductive layer.

5. Configuration of the Display Device

Figure 14:
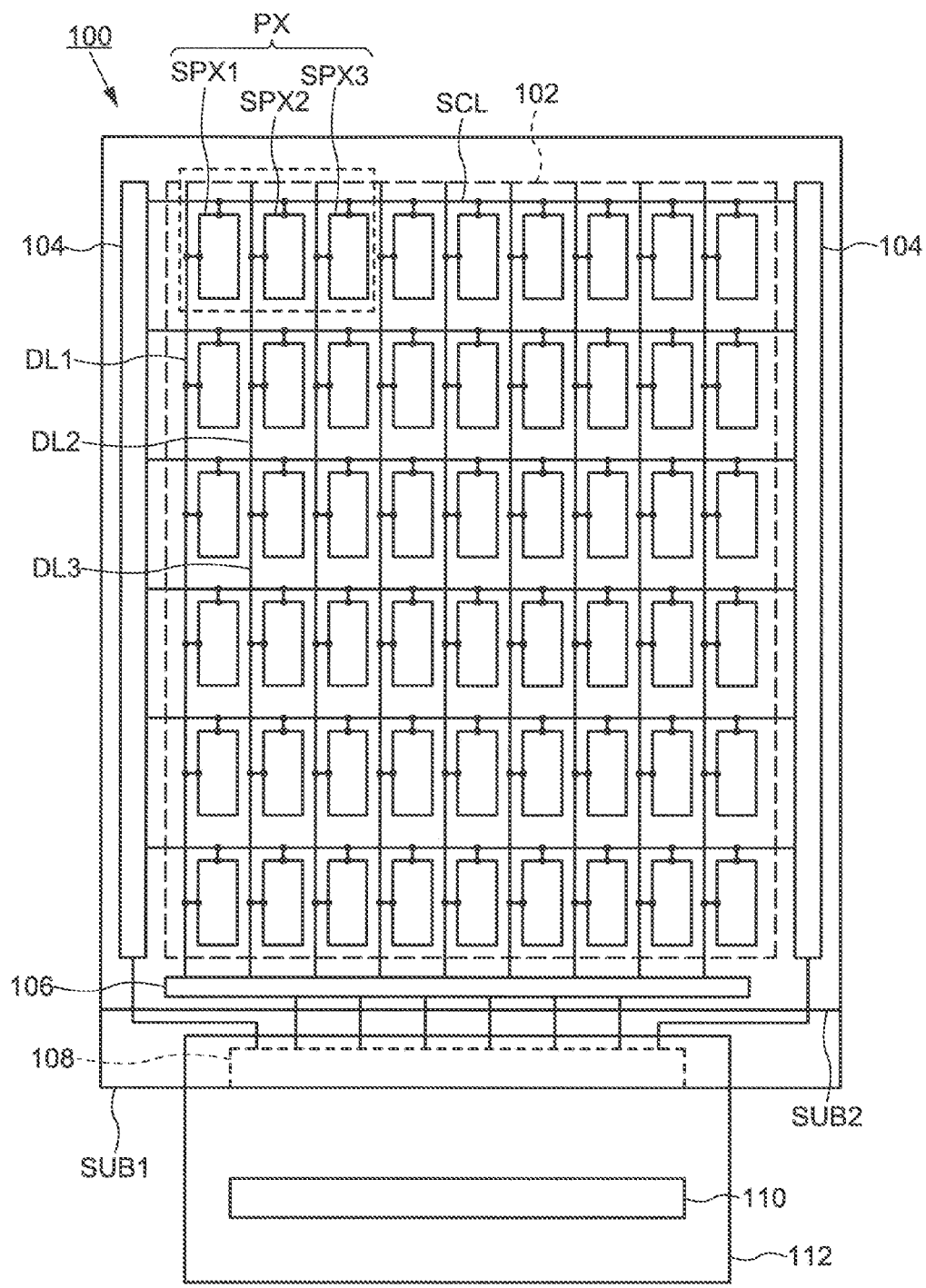
FIG. 14 is a diagram showing a configuration of a display device according to an embodiment of the present invention.

FIG. 14 shows a configuration of the display device 100 according to an embodiment of the present invention. The display device 100 includes the first substrate SUB1, the second substrate SUB2, the driver IC 110, and the flexible printed circuit board 112. As shown in this embodiment, the pixel PX including the first light shielding layer LS1 is arranged on the first substrate SUB1, and the second light shielding layer BM and the color filter layer CF are arranged on the second substrate SUB2. A sealing material (not shown) is arranged between the first substrate SUB1 and the second substrate SUB2. The first substrate SUB1 and the second substrate SUB2 are bonded by a sealing material.

The first substrate SUB1 includes a pixel part 102 in which the plurality of pixels PX are arranged, the scanning signal line driver circuit 104 arranged in an area outside the pixel part 102, the data signal line selection circuit 106, and a terminal part 108 forming a connection with the flexible printed circuit board 112. The driver IC 110 is mounted on the flexible printed circuit board 112. The pixel PX includes the first sub-pixel SPX1, the second sub-pixel SPX2, and the third sub-pixel SPX3. The scanning signal line SCL is connected to the scanning signal line driver circuit 104, and the first data signal line DL1, the second data signal line DL2, and the third data signal line DL3 are connected to the data signal line selection circuit 106.

The first transistor Tr1 shown in FIG. 1 is arranged in the first sub-pixel SPX1, the second sub-pixel SPX2, and the third sub-pixel SPX3. The second transistor Tr2 is utilized in the scanning signal line driver circuit 104 and the data signal line selection circuit 106. The pixel part 102 is constituted by the first sub-pixel SPX1, the second sub-pixel SPX2, and the third sub-pixel SPX3 shown in FIG. 3 and FIG. 5.

Each of the embodiments described above as an embodiment of the present invention can be appropriately combined and implemented as long as they do not contradict each other. Further, the addition, deletion, or design change of components as appropriate by those skilled in the art based on each embodiment are also included in the scope of the present invention as long as they are provided with the gist of the present invention.

It is understood that, even if the effect is different from those provided by each of the above-described embodiments, the effect obvious from the description in the specification or easily predicted by persons ordinarily skilled in the art is apparently derived from the present invention.

What is claimed is:

1. A display device, comprising;
a first substrate;
a plurality of pixels on the first substrate;
a plurality of first light shielding layers on the first substrate;
a second substrate; and
a second light shielding layer on the second substrate, wherein
the first light shielding layers include first parts extending in a first direction,
the second light shielding layer has openings in a closed shape and includes second parts extending in a second direction intersecting the first direction,
apertures of the plurality of pixels are defined by the first light shielding layers and the second light shielding layer,
each of the apertures has two first edges extending in the first direction and two second edges extending in the second direction,
the two first edges are defined by respective two of the first parts,
the two second edges are defined by respective two of the second parts, and
the second light shielding layer has third edges extending in the first direction, and the third edges overlap the first light shielding layers in a plan view.

2. The display device according to claim 1, further comprising a scanning signal line extending in the first direction, wherein the plurality of first light shielding layers overlaps the scanning signal line, and
a width of the first light shielding layers is wider than a width of the scanning signal line.

3. The display device according to claim 2, further comprising at least one insulating layer between the first light shielding layers and the scanning signal line,
wherein a distance between the first light shielding layers and the first substrate is smaller than a distance between the first substrate and the scanning signal line.

4. The display device according to claim 1, further comprising a data signal line extending in the second direction, wherein the data signal line overlaps the second light shielding layer.

5. The display device according to claim 1, further comprising a scanning signal line extending in the first direction and a data signal line extending in the second direction, wherein
the plurality of first light shielding layers overlaps the scanning signal line, and a width of the first light shielding layers is wider than a width of the scanning signal line,
the second light shielding layer overlaps the scanning signal line, the data signal line, and the first light shielding layers, and
a width of a region of the second light shielding layer overlapping the scanning signal line is narrower than the width of the first light shielding layers.

6. The display device according to claim 1, wherein the plurality of pixels includes a first pixel, a second pixel, and a third pixel arranged in the first direction,
wherein a width of the first light shielding layers is different for each pixel for each of the first pixel, the second pixel, and the third pixel.

7. The display device according to claim 6, wherein the first pixel is a blue pixel, the second pixel is a green pixel, and the third pixel is a red pixel,
wherein a width of a region of the first light shielding layers shielding the third pixel is narrower than a width of regions of the first light shielding layers shielding the first pixel and the second pixel.

8. The display device according to claim 1, further comprising a spacer between the first substrate and the second substrate,
wherein the first light shielding layers includes a light shielding pattern overlapping the spacer.

9. The display device according to claim 8, wherein the spacer fully overlaps the first light shielding layers in a plan view, and a first part of the spacer overlaps the second light shielding layer in the plan view, and a second part other than the first part is exposed from the second light shielding layer.

10. The display device according to claim 1, wherein the first light shielding layers are metal films and the second light shielding layer is a resin film.

11. The display device according to claim 1, wherein the plurality of first light shielding layers includes at least two laminated metal films,
wherein a width of an upper metal layer is larger than a width of a lower metal layer in the at least two laminated metal films.

12. The display device according to claim 1, further comprising a plurality of scanning signal lines extending in the first direction and a plurality of data signal lines extending in the second direction,
wherein the plurality of scanning signal lines and the plurality of data signal lines are arranged between the first light shielding layers and the second light shielding layer in a cross-sectional view.

13. The display device according to claim 12, further comprising a liquid crystal layer arranged between the first light shielding layers and the second light shielding layer in a cross-sectional view.

14. The display device according to claim 1, wherein each of the plurality of pixels includes a semiconductor layer, and
the semiconductor layer is arranged between the first light shielding layers and the second light shielding layer in a cross-sectional view.

15. The display device according to claim 14, wherein the semiconductor layer intersects the first light shielding layers.

16. The display device according to claim 14, wherein one end of the semiconductor layer overlaps the second light shielding layer.

* * * * *